(12) United States Patent
Nakamura et al.

(10) Patent No.: US 8,390,912 B2
(45) Date of Patent: Mar. 5, 2013

(54) ACTUATOR, OPTICAL SCANNER AND IMAGE FORMING DEVICE

(75) Inventors: Tomoaki Nakamura, Chino (JP); Yasushi Mizoguchi, Chino (JP)

(73) Assignee: Seiko Epson Corporation (JP)

( * ) Notice: Subject to any disclaimer, the term of this patent is extended or adjusted under 35 U.S.C. 154(b) by 720 days.

(21) Appl. No.: 11/969,381

(22) Filed: Jan. 4, 2008

(65) Prior Publication Data

US 2008/0165402 A1 Jul. 10, 2008

(30) Foreign Application Priority Data

Jan. 10, 2007 (JP) ................................ 2007-002910
Aug. 2, 2007 (JP) ................................ 2007-202195

(51) Int. Cl.
*G02B 26/08* (2006.01)
(52) U.S. Cl. ..................................... 359/224.1; 359/904
(58) Field of Classification Search .... 359/198.1–199.4, 359/200.6–200.8, 202.1, 221.2, 223.1–225.1, 359/226.2, 838, 846, 871, 872, 290–292; 250/204, 559.06, 559.29, 230, 234; 347/255–260; 353/39, 98–99

See application file for complete search history.

(56) References Cited

U.S. PATENT DOCUMENTS

| 6,774,445 B2 | 8/2004 | Mutoh et al. |
| 2005/0219674 A1 | 10/2005 | Asai et al. |
| 2006/0181756 A1 | 8/2006 | Yamazaki |

FOREIGN PATENT DOCUMENTS

| JP | 2002-131685 | 5/2002 |
| JP | 2002-156598 | 5/2002 |
| JP | 2004-191953 | 7/2004 |
| JP | 2005-128147 | 5/2005 |
| JP | 2006-227144 | 8/2006 |
| JP | 2006-330399 | 12/2006 |

*Primary Examiner* — Jennifer L. Doak
(74) *Attorney, Agent, or Firm* — Harness, Dickey & Pierce, P.L.C.

(57) ABSTRACT

An actuator, includes: a movable plate; a supporter to support the movable plate; a pair of linking portions to link the movable plate and the supporter so as to allow the movable plate to rotate relative to the supporter; and a piezoelectric element to rotate the movable plate. The piezoelectric element elongated and contracted by an energization twists the pair of linking portions to rotate the movable plate, and each of the pair of the linking portions includes an axial member extending from the movable plate and a returned portion that links the axial member and the supporter and is formed so as to return to a side adjacent to the movable plate.

14 Claims, 16 Drawing Sheets

ACTUATOR, OPTICAL SCANNER AND IMAGE FORMING DEVICE

BACKGROUND

1. Technical Field

The present invention relates to an actuator, an optical scanner, and an image forming device.

2. Related Art

An optical scanner is known that uses an actuator including a twist vibrator and draws images by optical scanning in a laser printer or the like. For example, refer to JP-A-2004-191953.

JP-A-2004-191953 discloses an actuator including a reflection mirror, a fixing frame to support the reflection mirror, and a pair of springs to link the both sides of the reflection mirror and the fixing frame. Each spring includes a linking portion disposed apart from the reflection mirror, a first spring linking the reflection mirror and the linking portion, and a second spring linking the linking portion and the fixing frame at a side opposite to the first spring.

Such actuator is heated by surrounding temperature or light irradiated to the reflection mirror, for example. As a result, the first spring thermally expands. That is, a pair of the first springs is elongated in the longitudinal direction (a direction, in parallel with a rotation center axis, being apart from the reflection mirror) by thermal expansion.

However, in the actuator disclosed in JP-A-2004-191953, the displacement of each linking portion in a direction, in parallel with the rotation center axis and apart from the reflection mirror, is hindered by the second spring. This causes each first spring to be displaced (e.g. be bent or buckle) from a desired position so as to reduce the deformation due to thermal expansion, and the reflection mirror is displaced in its thickness direction. This displacement results in the rotation center axis of the reflection mirror being shifted. As a result, desired rotation characteristics cannot be achieved.

In addition, when the actuator disclosed in JP-A-2004-191953 is used for an optical scanner, light reflected by the reflection mirror cannot be scanned to a desired position of an object, since an optical path length from a light source to the reflection mirror is changed due to the rotation center axis shift of the reflection mirror. That is, it is difficult to perform a desired scanning characteristic.

SUMMARY

An advantage of the invention is to provide an actuator, an optical scanner, and an image forming device that can perform a desired vibration characteristic by reducing or eliminating influences due to environmental temperature with achieving miniaturization.

According to a first aspect of the invention, an actuator includes: a movable plate; a supporter to support the movable plate; a pair of linking portions linking the movable plate and the supporter so as to allow the movable plate to rotate relative to the supporter; and a piezoelectric element to rotate the movable plate. The piezoelectric element elongated and contracted by an energization twists the pair of linking portions to rotate the movable plate. Each of the pair of the linking portions includes an axial member extending from the movable plate and a returned portion that links the axial member and the supporter, and is formed so as to return to a side adjacent to the movable plate. As a result, the actuator can be provided that can reduce or eliminate influences due to environmental temperature and perform a desired vibration characteristic.

It is preferable that each returned portion include a pair of elastic members that has an elongation shape and be capable of being elastically deformed and be provided so as to face each other across a rotation center axis of the movable plate. It becomes easy to maintain the rotation center axis of the movable plate constant even when thermal expansion occurs.

It is preferable that each returned portion include a driving member linking the axial member and each elastic member, and each elastic member be provided closer to the movable plate than the driving member. Accordingly, the movable plate can provide a larger rotation.

It is preferable that an elongation direction of each elastic member be in parallel with the rotation center axis of the movable plate. As a result, the driving member can be displaced smoothly when thermal expansion occurs.

It is preferable that a separation distance between the pair of elastic members gradually decrease from a side adjacent to the movable plate to a side adjacent to the driving member. The movable plate can provide a larger rotation with achieving miniaturization.

It is preferable that a separation distance between the pair of elastic members gradually increase from a side adjacent to the movable plate to a side adjacent to the driving member. The movable plate can provide a larger rotation with achieving miniaturization. In addition, the actuator can improve its response property.

It is preferable that the piezoelectric element be bonded to each elastic member in a longitudinal direction of the elastic member and be elongated and contracted in the longitudinal direction of the corresponding elastic element to bend the elastic member. This structure allows each elastic member to be uniformly bent entirely along the longitudinal direction. As a result, each elastic member can be efficiently bent with reducing stress applied to.

It is preferable that each piezoelectric element have a width larger than a width of the elastic member on which the piezoelectric element is bonded and be bonded so as to entirely cover the elastic member in a width direction of the elastic member. The elastic member can be greatly bent. In addition, manufacturing the actuator can be simplified.

It is preferable that the piezoelectric element be provided to correspond to each elastic member, and an end in an elongation-contraction direction of each piezoelectric element touch the corresponding elastic member, and an elongation-contraction of the piezoelectric element bend the elastic member. This structure allows large driving force to be transferred to each elastic member by the elongation-contraction of the piezoelectric element.

It is preferable that the piezoelectric element be bonded to an end in an elongation direction of the elastic member and serve as the supporter, and the end be located at a side opposite to the driving member. Accordingly, the actuator can be miniaturized.

It is preferable that each elastic member include a first elastic member and a second elastic member having a separation distance smaller than a separation distance of the first elastic element relative to the axial member, and the piezoelectric element be bonded to the first elastic member, and an elongation-contraction of the piezoelectric element in a longitudinal direction of the first elastic member bend the first elastic member to twist the second elastic member to displace the driving member. Accordingly, the actuator can be provided with low costs since the minimal number of piezoelectric elements is needed.

It is preferable that the second elastic member be provided in a vicinity of the rotation center axis. This structure allows the shape of the pair of axial members to be simplified and the rotation center axis shift of the movable plate to be suppressed.

It is preferable that the movable plate have a light reflector having light reflection property on a plate surface thereof. The actuator can be used for optical devices.

According to a second aspect of the invention, an optical scanner includes: a movable plate provided with a light reflector having light reflection property; a supporter to support the movable plate; a pair of linking portions linking the movable plate and the supporter so as to allow the movable plate to rotate relative to the supporter; and a piezoelectric element to rotate the movable plate. The piezoelectric element elongated and contracted by an energization twists the pair of linking portions to rotate the movable plate to scan light reflected by the light reflector. Each linking portion includes an axial member extending from the movable plate and a returned portion that links the axial member and the supporter, and is formed so as to return to a side adjacent to the movable plate.

As a result, the optical scanner can be provided that can reduce or eliminate influences due to environmental temperature and perform a desired vibration characteristic.

According to a third aspect of the invention, an image forming device includes an optical scanner that includes: a movable plate provided with a light reflector having light reflection property; a supporter to support the movable plate; a pair of linking portions linking the movable plate and the supporter so as to allow the movable plate to rotate relative to the supporter; and a piezoelectric element to rotate the movable plate. In the scanner, the piezoelectric element elongated and contracted by an energization twists the pair of linking portions to rotate the movable plate to scan light reflected by the light reflector. Each linking portion includes an axial member extending from the movable plate and a returned portion that links the axial member and the supporter, and is formed so as to return to a side adjacent to the movable plate.

As a result, the image forming device can be provided that can reduce or eliminate influences due to environmental temperature and perform a desired vibration characteristic.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of an actuator, an optical scanner, and an image forming device will be described with reference to accompanying drawings.

First Embodiment

A first embodiment of the actuator will be described.

Figure 1:
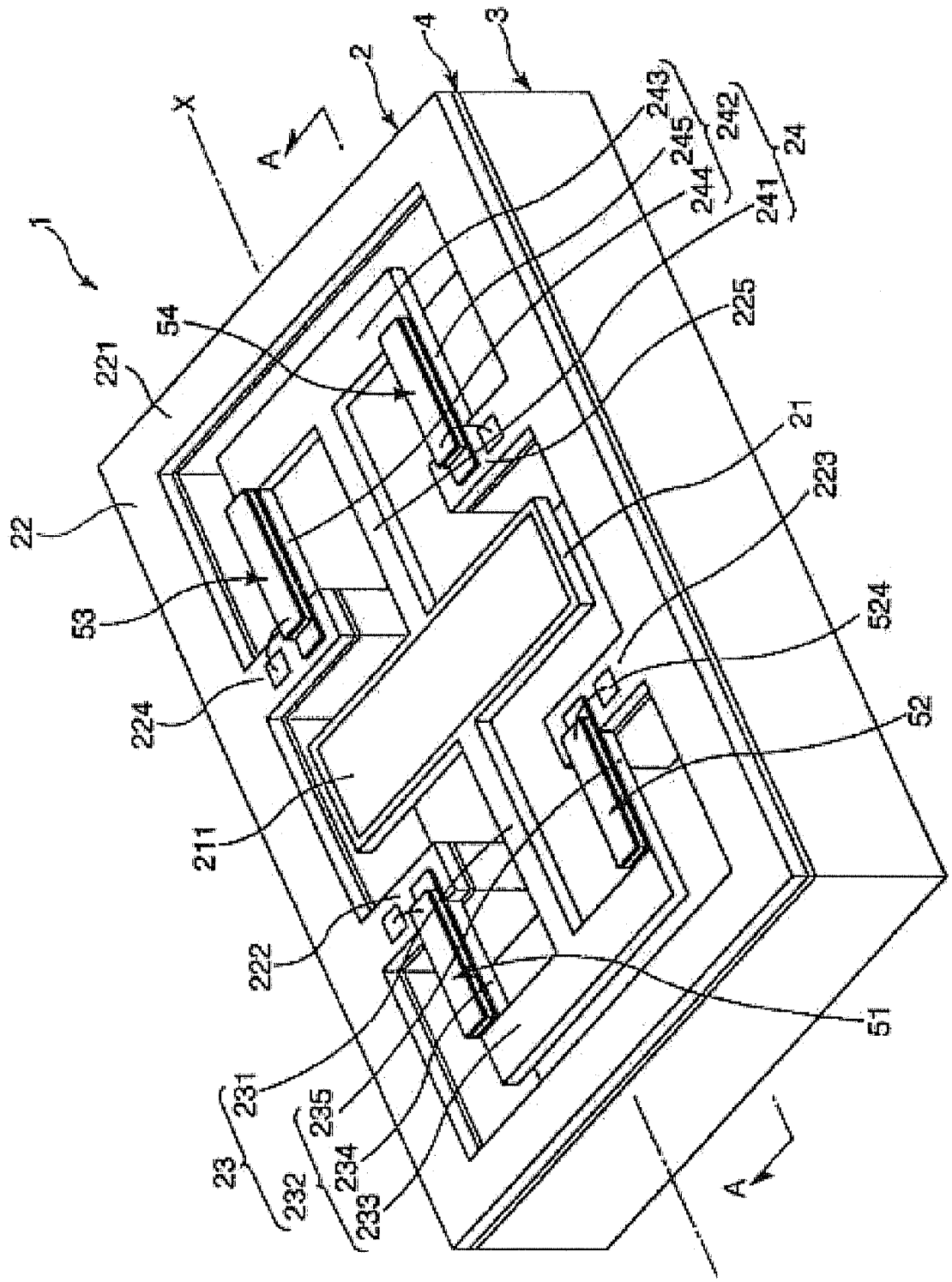
FIG. 1 is a perspective view illustrating an actuator of a first embodiment of the invention.
Figure 2:
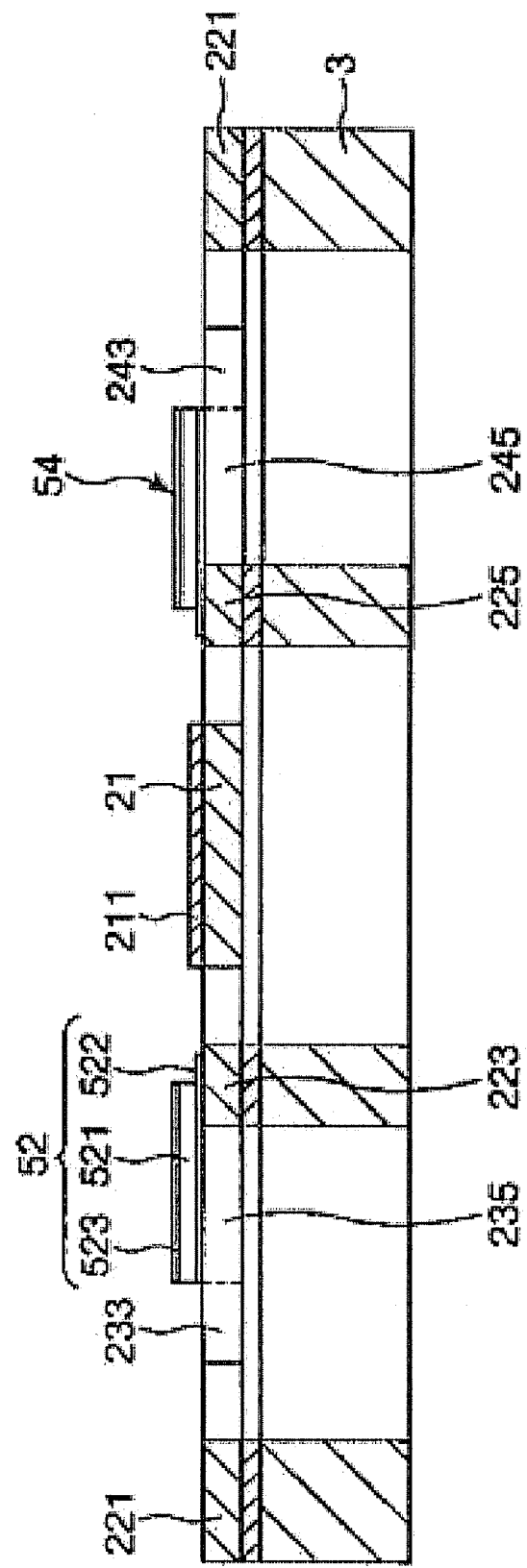
FIG. 2 is a sectional view taken along a line A-A of FIG. 1.
Figure 3A:
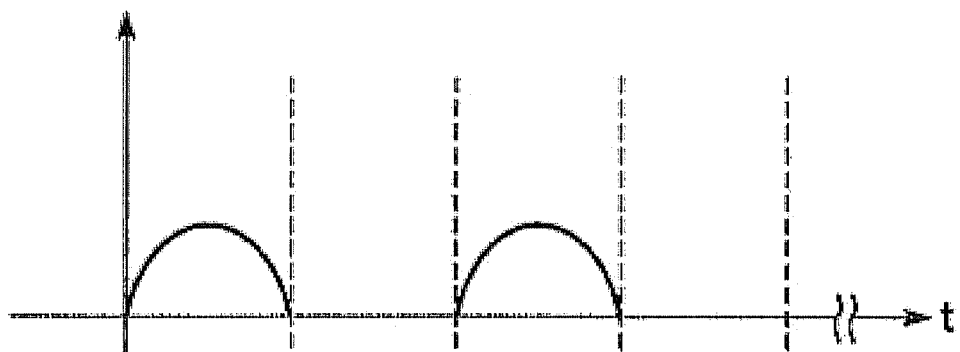
FIGS. 3A and 3B show an example of a waveform of voltage applied to a piezoelectric element included in the actuator shown in FIG. 1.
Figure 3B:
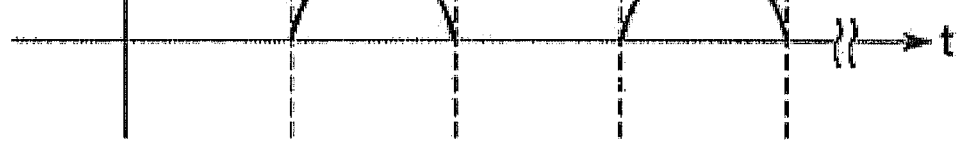

FIG. 1 is a perspective view of the actuator of the first embodiment. FIG. 2 is a sectional view taken along the line A-A in FIG. 1. FIGS. 3A and 3B show an example of a waveform of voltage applied to a piezoelectric element included in the actuator shown in FIG. 1. For expository convenience, the front side, the rear side, the right side, and the left side in FIG. 1 are described as "up," "down or low," "right," and "left" respectively. Likewise, the top side, the bottom side, the right side, and the left side in FIG. 2 are described as "up," "down or low," "right," and "left" respectively.

An actuator 1 includes a base 2 having a two-degree of freedom vibration system as shown in FIG. 1, and a support substrate 3 supporting the base 2 with a bonding layer 4 interposed therebetween.

The base 2 is provided with a movable plate 21, a supporter 22 to support the movable plate 21, a pair of linking portions 23 and 24 to link the movable plate 21 and the supporter 22, as shown in FIG. 1.

The portion 23 includes an axial member 231 extending from the movable plate 21, and a returned portion 232, which links the axial member 231 and the supporter 22 and is formed so as to be returned to a side adjacent to the movable plate 21. The returned portion 232 is composed of a driving member 233 connected to one end (opposite to the other end connected to the movable plate 21) of the axial member 231 along the longitudinal direction, and a pair of elastic members 234 and 235, both of which link the driving member 233 and the supporter 22.

The linking portion 24 includes an axial member 241 extending from the movable plate 21, and a returned portion 242, which links the axial member 241 and the supporter 22 and is formed so as to be returned to a side adjacent to the movable plate 21. The returned portion 242 is composed of a driving member 243 connected to one end (opposite to the other end connected to the movable plate 21) of the axial member 241 along the longitudinal direction, and a pair of elastic members 244 and 245, both of which link the driving member 243 and the supporter 22.

That is, the base 2 includes the movable plate 21, the supporter 22, the axial members 231 and 241, the driving members 233 and 243, and the elastic members 234, 235, 244, and 245. Each of them will now be described sequentially.

The movable plate 21 has a plate shape. A light reflector 211 having light reflection property is disposed on the upper surface of the movable plate 21. A pair of driving members 233 and 243 is disposed so as to face each other across the movable plate 21 in a plan view when the movable plate 21 is in an un-driven state (hereinafter, the view is referred to as a "plan view of the movable plate 21."

Each of driving members 233 and 243 has a plate shape. The pair of driving members 233 and 243 is symmetrically disposed relative to the movable plate 21 as shown in FIG. 1. The driving members 233 and 243 have the same shape and dimensions. However, the shape of the pair of driving members 233 and 243 is not particularly limited. They also may not have the same shape and dimensions.

The driving member 233 is linked to the movable plate 21 with the axial member 231 interposed therebetween while the driving member 243 is linked to the movable plate 21 with the axial member 241 interposed therebetween.

Each of axial members 231 and 241 has an elongated shape and is elastically deformable. The axial member 231 links the movable plate 21 and the driving member 233 so as to allow the movable plate 21 to rotate relative to the driving member 233. Likewise, the axial member 241 links the movable plate 21 and the driving member 243 so as to allow the movable plate 21 to rotate relative to the driving member 243.

The pair of axial members 231 and 241 is coaxially disposed. The movable plate 21 rotates about the axis (rotation center axis X).

The supporter 22 is formed so as to surround the circumference of the movable plate 21 and the pair of driving members 233 and 243 in the plan view of the movable plate 21. The supporter 22 includes a frame 221 having a frame shape, and protrusions 222, 223, 224, and 225 that protrude from the frame 221 inwardly into a space defined by the frame 221.

In a direction in parallel with the rotation axis X, a left side portion of the frame 221 and the driving member 233 creates a gap while a right side portion of the frame 221 and the driving member 243 creates another gap. The gaps are formed so as to tolerate each displacement of the driving members 233 and 243 due to thermal expansion.

The protrusions 222 and 223 are disposed between the movable plate 21 and the driving plate 233. The protrusions 222 and 223 are also symmetrically disposed relative to the rotation center axis X and so as to face each other across the rotation center axis X in the plan view of the movable plate 21. The protrusion 222 is linked to the driving member 233 with the elastic member 234 interposed therebetween while the protrusion member 223 is linked to the driving member 233 with the elastic member 235 interposed therebetween.

The protrusions 224 and 225 are disposed between the movable plate 21 and the driving member 243. The protrusions 224 and 225 are also symmetrically disposed relative to the rotation center axis X and so as to face each other across the rotation center axis X in the plan view of the movable plate 21. The protrusion 224 is linked to the driving member 243 with the elastic member 244 interposed therebetween while the protrusion member 225 is linked to the driving member 243 with the elastic member 245 interposed therebetween.

The shape of the supporter 22 is not limited as long as it can supports the movable plate 21 with the linking portions 23 and 24 so as to allow the movable plate 21 to rotate. For example, the frame 221 may be separated into a left part and a right part in FIG. 1, not having a frame shape, and further may be omitted. In addition, a particular shape of the frame 221 may omit the protrusions 222 to 225.

Each of the elastic members 234, 235, 244, and 245 has an elongated shape and is elastically deformable. Each of elastic members 234, 235, 244, and 245 extends in a direction in parallel with the rotation center axis X.

The elastic member 234 links the driving member 233 and the protrusion 222 while the elastic member 235 links the driving member 233 and the protrusion 223. Likewise, the elastic member 244 links the driving member 243 and the protrusion 224 while the elastic member 245 links the driving member 243 and the protrusion 225.

Each of the pair of elastic members 234 and 235 is disposed closer to the movable plate 21 than the driving member 233. The pair of elastic members 234 and 235 is also symmetrically disposed relative to the rotation center axis X and so as to face each other across the rotation center axis X in the plan view of the movable plate 21.

Likewise, each of the pair of elastic members 244 and 245 is disposed closer to the movable plate 21 than the driving member 243. The pair of elastic members 244 and 245 is also symmetrically disposed relative to the rotation center axis X and so as to face each other across the rotation center axis X in the plan view of the movable plate 21.

Thus, the actuator 1 can be miniaturized since the elastic members 234 and 235 are disposed closer to the movable plate 21 than the driving member 233 while the elastic members 244 and 245 are disposed closer to the movable plate 21 than the driving member 243. In addition, this structure can reduce influence or eliminate influences due to environmental temperature to show and maintain a desired vibration characteristic, as will be described later.

A piezoelectric element 51, which will be described later, is bonded on the upper surface of the elastic member 234. Likewise, a piezoelectric element 52 is bonded on the upper surface of the elastic member 235, a piezoelectric element 53 is bonded on the upper surface of the elastic member 244, and a piezoelectric element 54 is bonded on the upper surface of the elastic member 245. The piezoelectric elements 51 to 54 are a driving source to rotate the movable plate 21 about the rotation center axis X.

The base 2 is structured as above described and included in the actuator 1. In the actuator 1, the piezoelectric elements 51 and 52 elongated and contracted by an energization bend the pair of elastic members 234 and 235 in the thickness direction of the movable plate 21, rotating the driving member 233 about the rotation center axis X. Likewise, the piezoelectric elements 53 and 54 elongated and contracted by an energization bend the pair of elastic members 244 and 245 in the thickness direction of the movable plate 21, rotating the driving member 243 about the rotation center axis X. As a result, rotating the pair of driving members 233 and 243 twists each of the pair of axial members 231 and 241, rotating the movable plate 21 about the rotation center axis X.

Accordingly, the base 2 has two vibration systems: a first vibration system composed of the elastic members 234, 235, 244, and 245, and the pair of driving members 233 and 243; and a second vibration system composed of the pair of axial members 231 and 241, and the movable plate 21. That is, the actuator 1 has two-degree-of-freedom vibration system composed of the first vibration system and the second vibration system.

The base 2 is, for example, mainly made of silicon. In this case, the movable plate 21, the axial members 231 and 241, the driving members 233 and 243, the elastic members 234, 235, 244, and 245, and the support 22 (frame 221 and the protrusions 222 to 225) are integrally formed. The use of silicon as a main material can achieve superior durability as well as superior rotation characteristics. The material also enables the base to be finely processed. Thus, the actuator 1 can be miniaturized.

The base 2 may include the movable plate 21, the supporter 22, the axial members 231 and 241, the driving members 233 and 243, and the elastic members 234, 235, 244, and 245 all of which are formed from a substrate having a multilayered structure, such as SOI substrates. In this case, the movable plate 21, the supporter 22, the axial members 231 and 241, the driving members 233 and 243, and the elastic members 234, 235, 244, and 245 are preferably integrally formed from one layer of the multilayered substrate.

Such base 2 is bonded to the support substrate 3 with the bonding layer 4 interposed therebetween.

The support substrate 3 is, for example, mainly made of glass, silicon, or $SiO_2$. The support substrate 3 is formed in a frame shape coinciding with the shape of the support 22 in the plan view of the movable plate 21.

The shape of the support substrate 3 is not particularly limited as long as it can support the base 2 without hindering the vibration system from being driven. For example, the bottom (opposite to the base 2) of the support substrate 3 may not be opened. That is, the support substrate 3 may have a recess in the upper surface. In addition, a particular shape of the frame 22 may omit the support substrate 3.

The bonding layer 4, which is formed between the support substrate 3 and the base 2, is, for example, mainly made of glass, silicon, or $SiO_2$. The bonding layer 4 may be omitted. That is, the base 2 and the support substrate 3 may be directly bonded.

Next, the piezoelectric elements 51 to 54 will be described that serve as a driving source to rotate the movable plate 21. Since the piezoelectric elements 51 to 54 have the same structure, only the piezoelectric element 52 will be representatively described. The description of the piezoelectric elements 51, 53, and 54 is omitted.

The piezoelectric element 52 is bonded to the elastic member 235 so as to cover the entire upper surface of the elastic member 235 and across the border of the elastic member 235 and the supporter 22 (the protrusion 223). The piezoelectric element 52 is also coupled to a power supply circuit (not shown), which energizes the piezoelectric element 52 to be elongated and contracted in the longitudinal direction of the elastic member 235.

The piezoelectric element 52 includes a piezoelectric layer 521 mainly made of a piezoelectric material, and a pair of electrodes 522 and 523 that sandwich the piezoelectric layer 521 as shown in FIG. 2.

Examples of piezoelectric materials used for the piezoelectric layer 521 include zinc oxide, aluminum nitride, lithium tantalite, lithium niobate, potassium niobate, lead zirconate titanate (PZT), and barium titanate. One or more than one in mixture of the above can be used. Particularly, one mainly containing at least one of zinc oxide, aluminum nitride, lithium tantalite, lithium niobate, potassium niobate, and lead zirconate titanate (PZT) is preferably used. With the piezoelectric layer 521 made of such material, the actuator 1 can be driven at higher frequency.

The electrode 522 is formed so as to cover the entire area under the piezoelectric layer 521 and expose a part thereof on the protrusion 223. The electrode 522 is bonded to the elastic member 235 and the protrusion 223.

On the other hand, the electrode 523 is formed so as to cover the entire upper surface of the piezoelectric layer 521. The electrode 523 is connected to a terminal 524 disposed on the protrusion 223 with a wiring wire formed by wire bonding, for example.

Material to form the electrodes 522 and 523 (the terminal 524) is not particularly limited as long as it has conductivity.

The piezoelectric element 52 may be directly formed on the elastic member 235 by a thin film forming method such as CVD, sputtering, a hydrothermal synthesis method, a sol-gel method, and a fine-particle spraying method. An individually manufactured piezoelectric element (e.g. a bulk element) may be bonded on the elastic member 235 (the base 2) with a resin material (adhesive) or the like.

The structure of the piezoelectric element 52 is not limited to the above described as long as it can be elongated and contracted in the longitudinal direction of the elastic member 235. For example, the terminal 524 may not be formed on the protrusion 223 or may be omitted.

The actuator 1 is driven as follows.

For example, a voltage shown in FIG. 3A is applied to the piezoelectric elements 51 and 53 while a voltage shown in FIG. 3B is applied to the piezoelectric elements 52 and 54. That is, the following two states are alternately repeated: a first state in which voltage is applied to the piezoelectric elements 51 and 53; and a second state in which voltage is applied to the piezoelectric elements 52 and 54.

Since the linking portions 23 and 24 show the same torsion-deformation, the torsion-deformation of the linking portion 23 will be representatively described. The description of the torsion-deformation of the linking portion 24 is omitted.

First, the first state will be described. The piezoelectric element 51 is elongated by an energization, resulting in an end portion, adjacent to the driving member 233, of the elastic member 234 in its longitudinal direction being displaced downwardly (to the support substrate 3). In contrast, an end portion, adjacent to the driving member 233, of the elastic member 235 in its longitudinal direction is displaced upwardly (to a side opposite to the support base 3) by a reaction of the bending deformation of the elastic member 234.

As a result, one portion, adjacent to the elastic member 234 relative to the rotation center axis X, of the driving member 233 is displaced downwardly while the other portion, adjacent to the elastic member 235 relative to the rotation center axis X, of the driving member 233 is displaced upwardly. Consequently, the driving member 233 tilts about the rotation center axis X.

Next, the second state will be described. The piezoelectric element 52 is elongated by an energization, resulting in an end portion, adjacent to the driving member 233, of the elastic member 235 in its longitudinal direction being displaced downwardly. In contrast, an end portion, adjacent to the driving member 233, of the elastic member 234 in its longitudinal direction is displaced upwardly by a reaction of the bending deformation of the elastic member 235.

As a result, one portion, adjacent to the elastic member 235 relative to the rotation center axis X, of the driving member 233 is displaced downwardly while the other portion, adjacent to the elastic member 234 relative to the rotation center axis X, of the driving member 233 is displaced upwardly. Consequently, the driving member 233 tilts about the rotation center axis X.

The above alternative repetition bends the pair of elastic members 234 and 235 in an opposite direction each other, allowing the driving member 233 to rotate about the rotation center axis X. The rotation of the driving member 233 twists the axial member 231, allowing the movable plate 21 to rotate about the rotation center axis X.

In the embodiment, the movable plate 21 is rotated by alternately repeating two conditions: the first state in which voltage is applied to the piezoelectric elements 51 and 53, and the second state in which voltage is applied to the piezoelectric elements 52 and 54. However, the method is not particularly limited to this as long as it can rotate the movable plate 21. For example, an alternative voltage having a 180-degree different phase (i.e. opposite phase) may be intermittently applied to the piezoelectric elements 51 and 53, and the piezoelectric elements 52 and 54.

The structure of the actuator 1 has been described in detail hereinabove.

The actuator 1 may be heated with heat supplied, resulting in the axial members 231 and 241 being thermally expanded. The causes of the thermal expansion include surrounding temperature change, and heat produced by the actuator 1 in itself.

The actuator of the embodiment particularly uses the piezoelectric element as a driving source that produces heat by an energization. The heat produced by the piezoelectric element causes the thermal expansion of the actuator 1.

In another case in which the actuator 1 is used for an optical scanner, part of light irradiated to the light reflector 211 is converted into heat without being reflected. As a result, the actuator 1 is thermally expanded.

This thermal expansion induces particularly each of the axial members 231 and 241 having an elongated shape, and the elastic members 234, 235, 244, and 245 having an elongated shape to extend in its longitudinal direction.

Here, the pair of elastic members 234 and 235 is disposed closer to the movable plate 21 than the driving member 233 in the actuator 1 (the linking portion 24 also shows the same). Thus, even when the axial members 231 and 241 are thermally expanded, the rotation center axis X can be kept constant at a desired position with tolerating the thermal deformation. That is, the movable plate 21 can be prevented from being displaced in its thickness direction.

Specifically, when the axial member 231 thermally expands, the axial member 231 extends its length in the longitudinal direction. In other words, the axial member 231 extends in the longitudinal direction as the temperature of the axial member 231 increases.

On the other hand, the driving member 233 is displaced so as to be apart from the movable plate 21 by the thermal expansion of each of the elastic members 234 and 235. This displacement of the driving member 233 allows the axial member 231 to be deformed by thermal expansion (i.e., elongation in the longitudinal direction).

The actuator 1 can reduce the displacement of the movable plate 21 in its thickness direction when the axial member 231 thermally expands. As a result, the actuator 1 can rotate the movable plate 21 while the rotation center axis X is kept constant even when thermal expansion occurs, performing a desired vibration characteristics.

When the actuator 1 is used for an optical scanner, an optical path length (separation distance) from a light source to the light reflector 211 and an optical path length (separation distance) from the light reflector 21 to a scanning object can be kept at a desired distance. As a result, the actuator 1 can maintain a desired scan characteristic even when thermal expansion occurs.

In the actuator 1, the pair of elastic members 234 and 235 is symmetrically disposed relative to the rotation center axis X and so as to face each other across the rotation center axis X. Because of this structure, the rotation center axis X is easily kept constant at a desired position even when each of the axial member 231 and the elastic members 234 and 235 is thermally expanded.

In addition, in the actuator 1, the pair of elastic members 234 and 235 is disposed so that each longitudinal direction is in parallel with the longitudinal direction of the axial member 231. As a result, when each of the axial member 231 and the elastic members 234 and 235 is thermally expanded, the driving member 233 can be easily displaced so as to be apart from the movable plate 21.

In the embodiment, the piezoelectric elements 51 to 54 are used as a driving source to rotate the movable plate 21. Since the piezoelectric element produces heat by an energization, the above effects are further enhanced by combining the piezoelectric elements 51 to 54 and the base 2.

Second Embodiment

Next, an actuator according to a second embodiment of the invention will be described.

Figure 4:
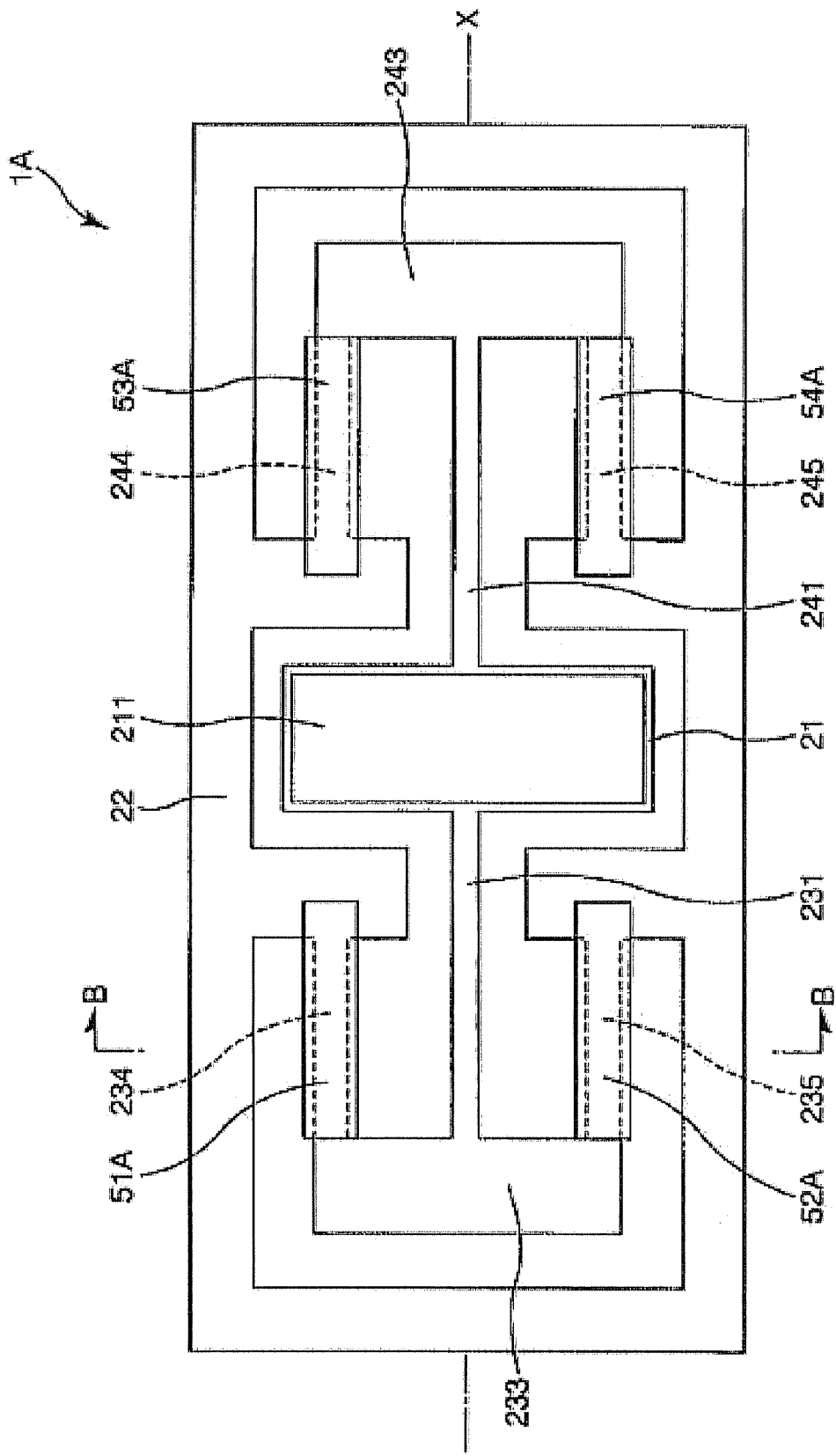
FIG. 4 is a top view illustrating an actuator of a second embodiment of the invention.
Figure 5:
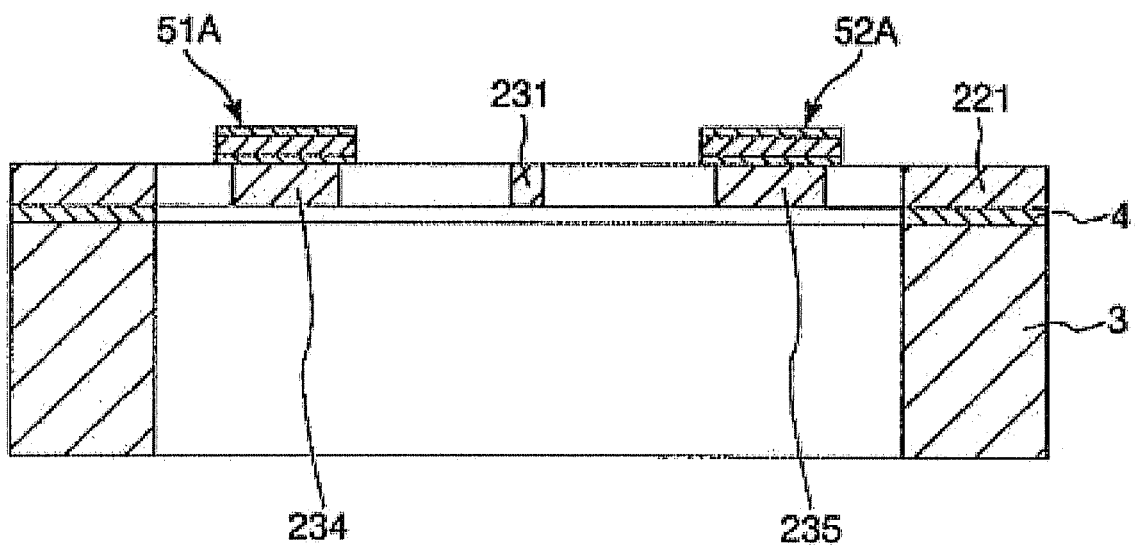
FIG. 5 is a sectional view taken along a line B-B in FIG. 4.

FIG. 4 is a top view illustrating the actuator of the second embodiment. FIG. 5 is a sectional view taken along the line B-B in FIG. 4. For expository convenience, the top side in FIG. 5 is described as "up," while the bottom side is described as "down or low."

The following description of an actuator 1A of the second embodiment focuses primarily on differences from the actuator 1 of the first embodiment, and similar points will be omitted.

The actuator 1A of the second embodiment is nearly the same as the actuator 1 of the first embodiment except for the shapes of the piezoelectric elements 51A to 54A. The same numeral is given to the same structure of the first embodiment.

Since the piezoelectric elements 51A to 54A have the same structure, only the piezoelectric element 51A will be representatively described. The description of the piezoelectric elements 52A to 54A is omitted.

The piezoelectric element 51A has a width larger than the width (the length perpendicular to the rotation center axis X in the plan view of the movable plate 21) of the elastic member 234 and is bonded to the elastic member 234 so as to entirely cover the elastic member 234 in its width direction.

The piezoelectric element 51A having a width larger than that of the elastic member 234 can transfer a desired driving force to the elastic member 234 by being elongated and contracted (i.e. a desired bending deformation amount of the elastic member 234 is achieved) when the piezoelectric element 51A is bonded so as to entirely cover the elastic member 234 in its width direction even if the bonding position of the piezoelectric element 51A to the elastic member 234 is shifted from the predetermined position in the width direction of the elastic member 234 in manufacturing the actuator 1.

As a result, the manufacturing of the actuator 1A can be simplified and its mounting time (manufacturing time) can be reduced since a desired vibration characteristic can be performed without a fine adjustment of a bonding position when the piezoelectric element 51A is bonded to the elastic member 234. Such effect is specifically enhanced when a process is included in which the piezoelectric element 51A is manufactured separately from the base 2, and then the piezoelectric element 51A is bonded to the elastic member 234 with a resin material (adhesive) or the like interposed therebetween.

The piezoelectric elements 52A to 54A also have the same shape and are disposed in the same manner. The use of the piezoelectric elements 51A to 54A allows each bending deformation amount of the elastic members 234, 235, 244, and 245 to be nearly equalized with extreme ease.

The second embodiment can achieve the same effects of the first embodiment.

Third Embodiment

Next, an actuator according to a third embodiment of the invention will be described.

Figure 6:
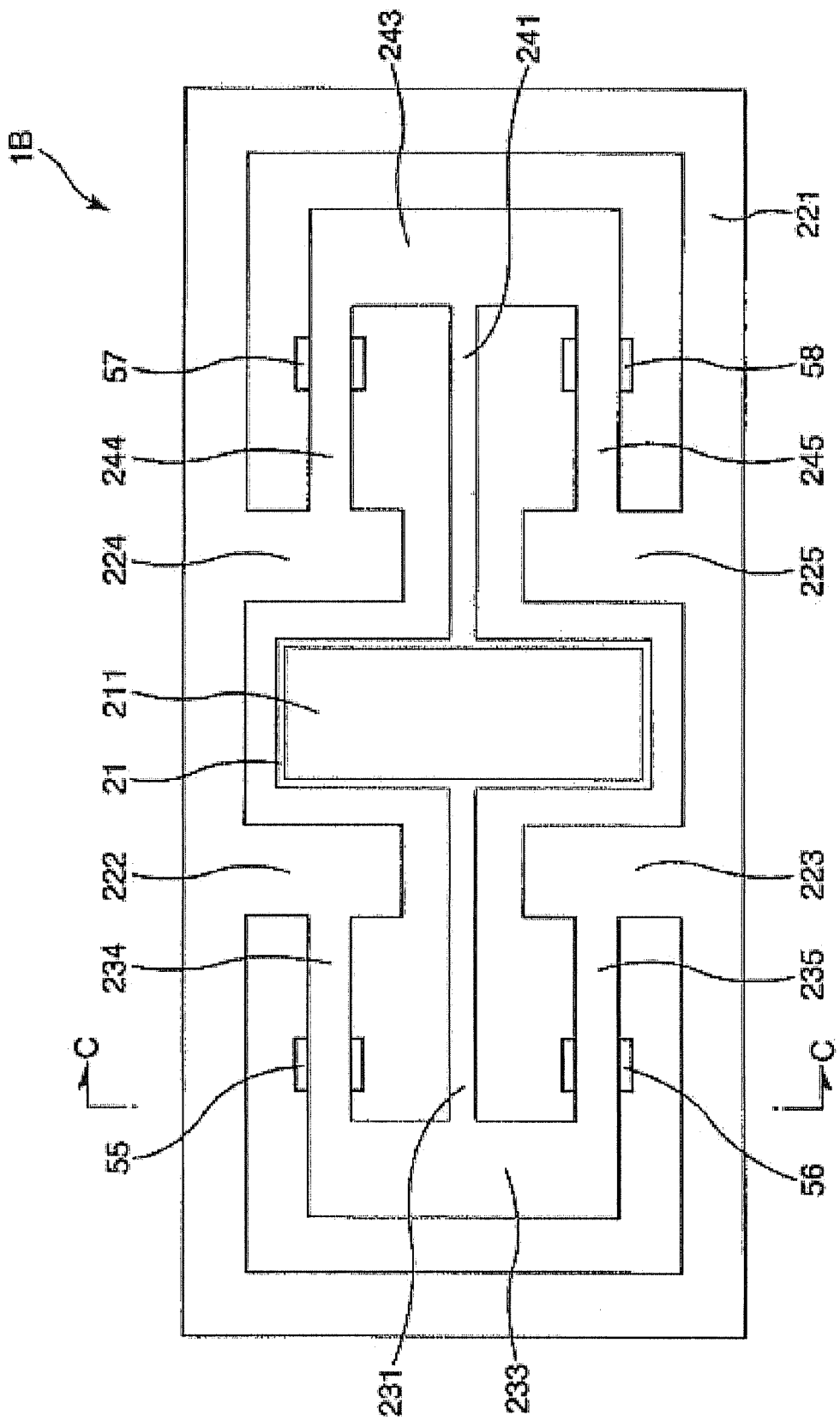
FIG. 6 is a top view illustrating an actuator of a third embodiment of the invention.
Figure 7:
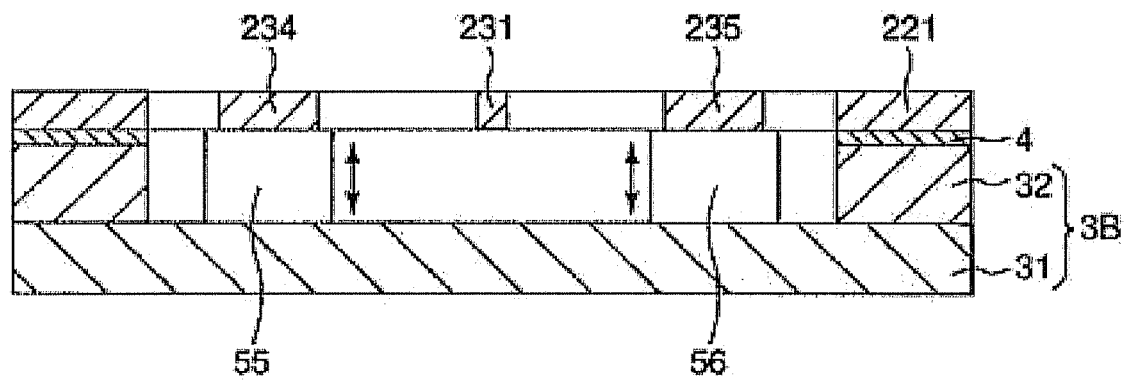
FIG. 7 is a sectional view taken along a line C-C in FIG. 6.
Figure 8:
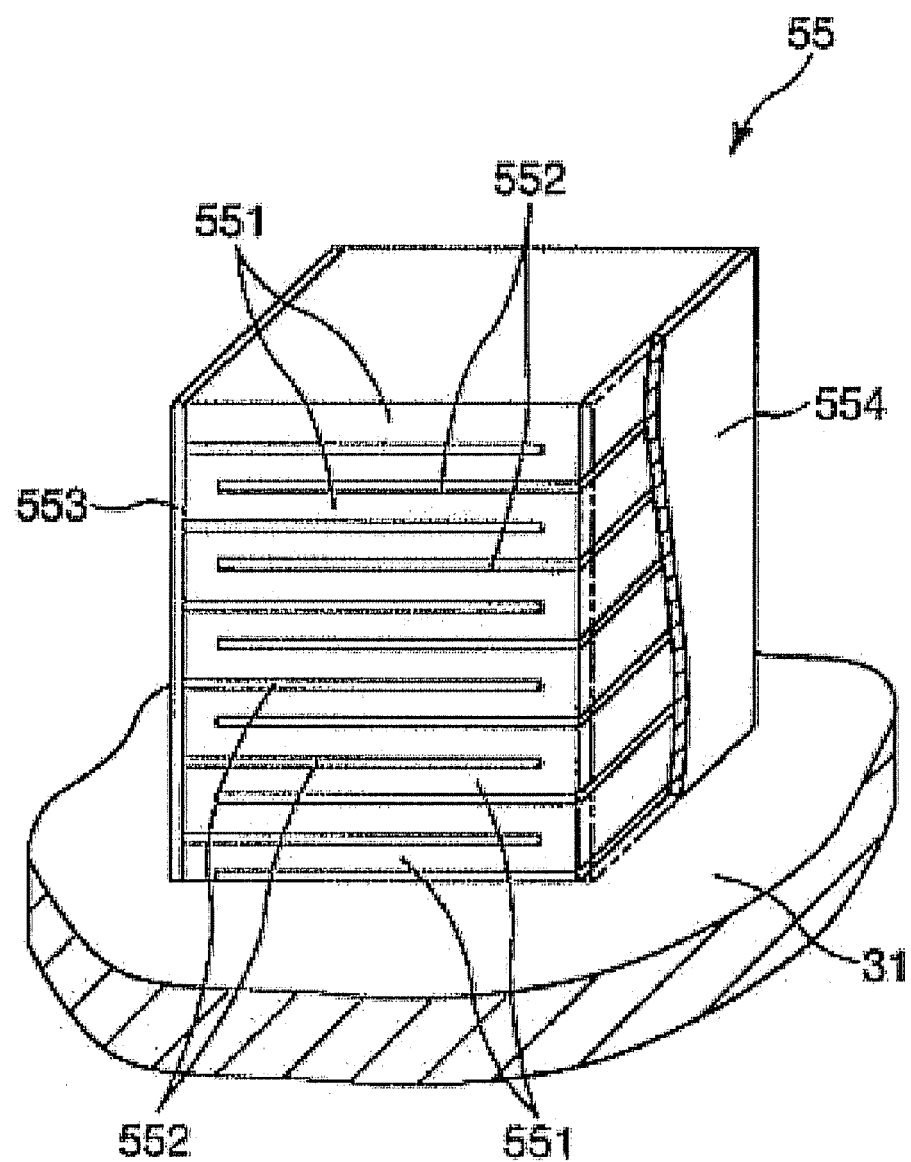
FIG. 8 is an enlarged view of a piezoelectric element included in the actuator shown in FIG. 6.
Figure 9A:
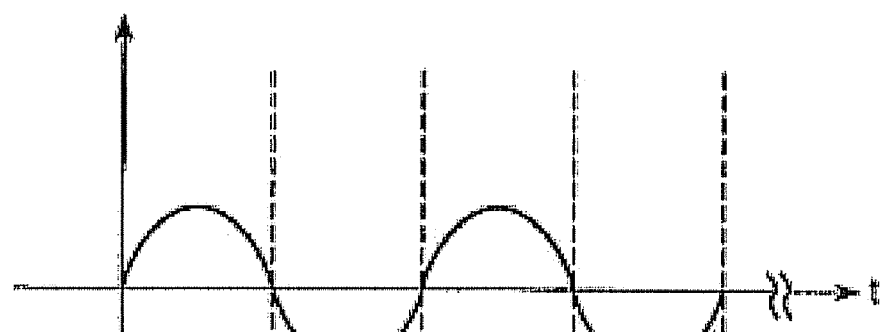
FIGS. 9A and 9B show an example of a waveform of voltage applied to a piezoelectric element included in the actuator shown in FIG. 6.
Figure 9B:
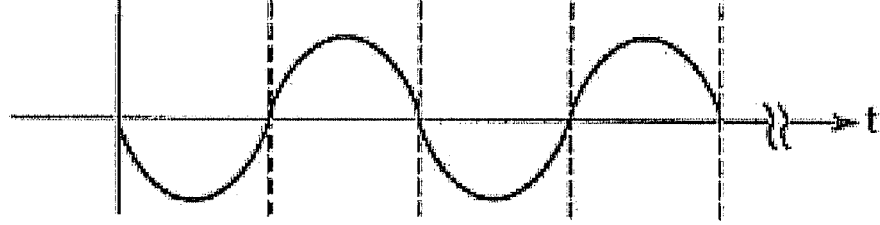

FIG. 6 is a top view illustrating the actuator of the third embodiment. FIG. 7 is a sectional view taken along the line C-C in FIG. 6. FIG. 8 illustrates a piezoelectric element. FIGS. 9A and 9B illustrates an example of voltage applied to the piezoelectric element. For expository convenience, the top side in FIG. 7 is described as "up," while the bottom side is described as "down or low."

The following description of an actuator 1B of the third embodiment focuses primarily on differences from the actuator 1 of the first embodiment, and similar points will be omitted.

The actuator 1B of the third embodiment is nearly the same as the actuator 1 of the first embodiment except for the structures and arrangements of the piezoelectric elements 55 to 58, and the structure of the support substrate 3. The same numeral is given to the same structure of the first embodiment.

A support substrate 3B includes a base 31 having a plate shape and a wall 32 that is bonded to the upper surface of the base 31 and formed so as to coincide with the shape of the supporter 22 in the plan view of the movable plate 21.

On the upper surface of the base 31, the piezoelectric element 55 is bonded to a portion facing the elastic member 234, the piezoelectric element 56 is bonded to a portion facing the elastic member 235, the piezoelectric element 57 is bonded to a portion facing the elastic member 244, and the piezoelectric element 58 is bonded to a portion facing the elastic member 245.

Since the piezoelectric elements 55 to 58 have the same structure and same arrangement, only the piezoelectric element 55 will be representatively described. The description of the piezoelectric elements 56 to 58 is omitted.

The piezoelectric element 55 is bonded to the base 31 of the support substrate 3 at its lower end surface, and bonded to the lower surface of the elastic member 234 at its upper surface in the thickness direction of the movable plate 21 (i.e. an up-and-down direction in FIG. 7). The piezoelectric element 55 is elongated and contracted in the thickness direction of the movable plate 21 (i.e. the direction indicated by a double-ended arrow in FIG. 7).

The piezoelectric element 55 includes a plurality of piezoelectric layers 551 and a plurality of electrode layers 552 to supply voltage to each of the plurality of piezoelectric layers 551. Each piezoelectric layer 551 and each of the plurality of electrode layers 552 are alternately layered in the thickness direction of the movable plate 21. That is, the piezoelectric element 55 is a layered piezoelectric element elongated and contracted in the thickness direction of the movable plate 21. The piezoelectric element 55 can provide a large displacement amount while the driving voltage is reduced.

The piezoelectric layers 551 are formed so that each piezoelectric layer 551 has a polarization direction different from the adjacent one. That is, the polarization direction of the piezoelectric layer 551 odd numbered layer from the base 31 side is opposite to the polarization direction of the piezoelectric layer 551 even numbered layer from the base 31 side. This structure allows the piezoelectric element 55 more reliably to provide a larger displacement amount while the driving voltage is reduced. In the specification, the term "polarization direction" means a direction directing from one surface in which negative charges excessively exist to the other surface in which positive charges excessively exist of the piezoelectric layer, when excessive negative charges exist in the one surface while excessive positive charges exist in the other surface (in a case of intrinsic polarization or residual polarization) in a state of applying no electric field and stress to the piezoelectric layer.

Each electrode layer 552 is interposed between the piezoelectric layers 551 adjacent each other. The electrode layers 552 are formed so as to provide an overlapped region (an active region) of two electrodes layers 552 adjacent each other. The electrode layer 552 odd numbered layer from the base 31 side is connected to a common electrode 553 disposed on the side face of the piezoelectric element 55 while the electrode layer 552 even numbered layer from the base 31 side is connected to a common electrode 554 disposed on the face, opposite to the face on which the common electrode 553 is disposed, of the piezoelectric element 55.

Voltage is applied to each piezoelectric layer 551 in the overlapped region by applying voltage between the common electrodes 553 and 554. As a result, each piezoelectric layer 551 is elongated and contracted in the thickness direction of the movable plate 21.

The structure of the piezoelectric element 55 is not particularly limited as long as it can be elongated and contracted in the thickness direction of the movable plate 21. The common electrodes 553 and 554 may not be disposed on the side faces of the piezoelectric element 55. For example, they may be formed to the base 31.

The actuator 1B provided with the piezoelectric elements 55 to 58 can rotate the movable plate 21 as follows, as an example.

For example, a voltage shown in FIG. 9A is applied to the piezoelectric elements 55 and 57 while a voltage shown in FIG. 9B is applied to the piezoelectric elements 56 and 58. That is, two voltages each having a 180-degree phase difference from the other are applied to the piezoelectric elements 55 and 57, and the piezoelectric elements 56 and 58. As a result, the following two states are alternately repeated: a first state in which the piezoelectric elements 55 and 57 are elongated while the piezoelectric elements 56 and 58 are contracted; and a second state in which the piezoelectric elements 55 and 57 are contracted while the piezoelectric elements 56 and 58 are elongated.

Next, deformations of the linking portions 23 and 24 in each of the first and second states will be specifically described with reference to FIG. 7. Since the linking portions 23 and 24 show the same deformation, only the linking portion 23 will be representatively described. The description of the linking portion 24 is omitted.

In the first state, an end portion, adjacent to the driving member 233, of the elastic member 234 in its longitudinal direction is displaced upwardly while an end portion, adjacent to the driving member 233, of the elastic member 235 in its longitudinal direction is displaced downwardly since the piezoelectric element 55 is elongated while the piezoelectric element 56 is contracted.

As a result, one portion, adjacent to the elastic member 234 relative to the rotation center axis X, of the driving member 233 is displaced upwardly while the other portion, adjacent to the elastic member 235 relative to the rotation center axis X, of the driving member 233 is displaced downwardly. Consequently, the driving member 233 is tilted about the rotation center axis X.

On the other hand, in the second state, an end portion, adjacent to the driving member 233, of the elastic member 234 in its longitudinal direction is displaced downwardly while an end portion, adjacent to the driving member 233, of the elastic member 235 in its longitudinal direction is displaced upwardly since the piezoelectric element 55 is contracted while the piezoelectric element 56 is elongated.

As a result, one portion, adjacent to the elastic member 234 relative to the rotation center axis X, of the driving member 233 is displaced downwardly while the other portion, adjacent to the elastic member 235 relative to the rotation center axis X, of the driving member 233 is displaced upwardly. Consequently, the driving member 233 is tilted about the rotation center axis X.

The driving member 233 is rotated by repeating the first and second states as described above. The rotation of the driving member 233 twists the axial member 231 to rotate the movable plate 21.

The third embodiment can also achieve the same effects of the first embodiment.

Fourth Embodiment

Next, an actuator according to a fourth embodiment of the invention will be described.

Figure 10:
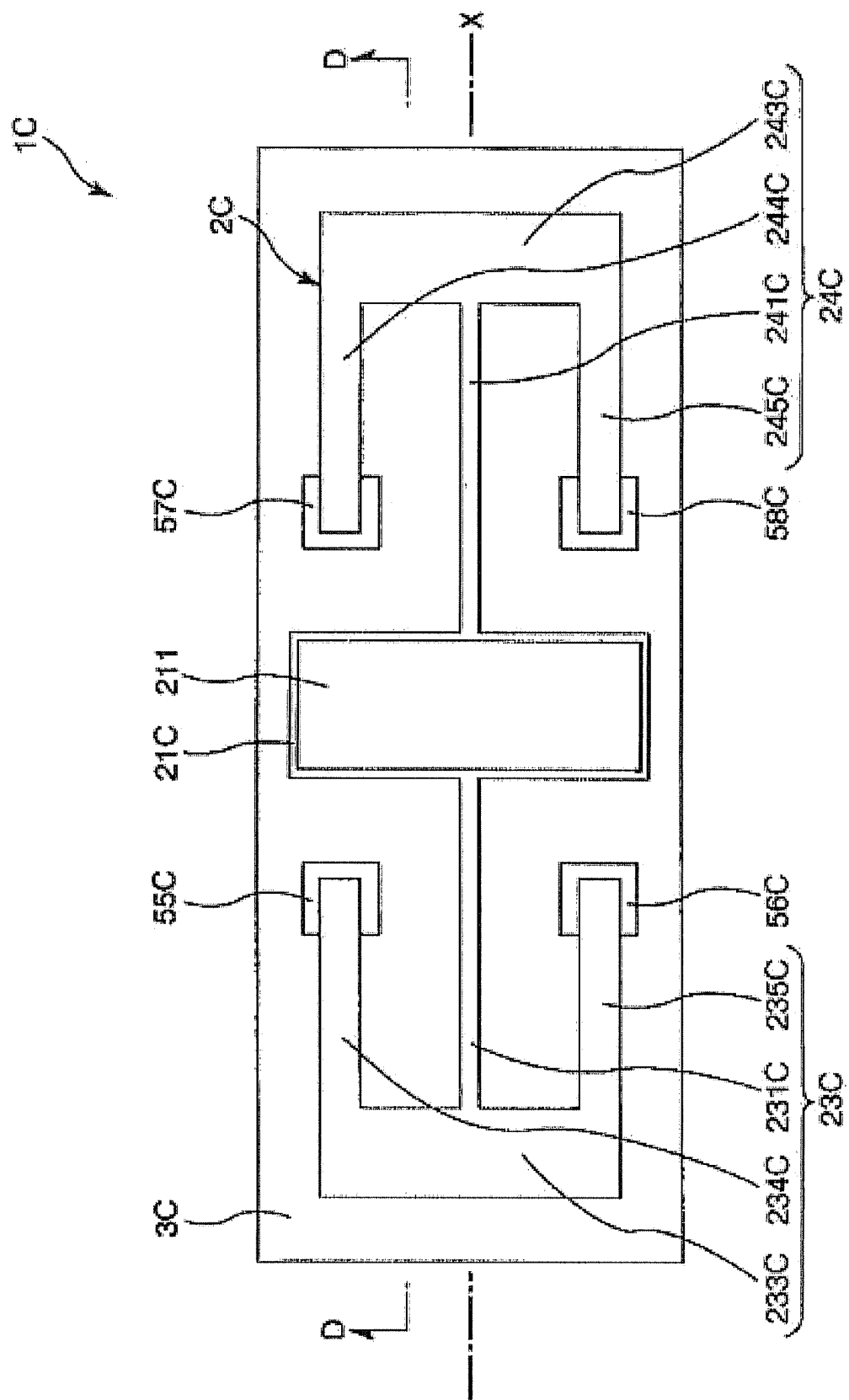
FIG. 10 is a top view illustrating an actuator of a fourth embodiment of the invention.
Figure 11:
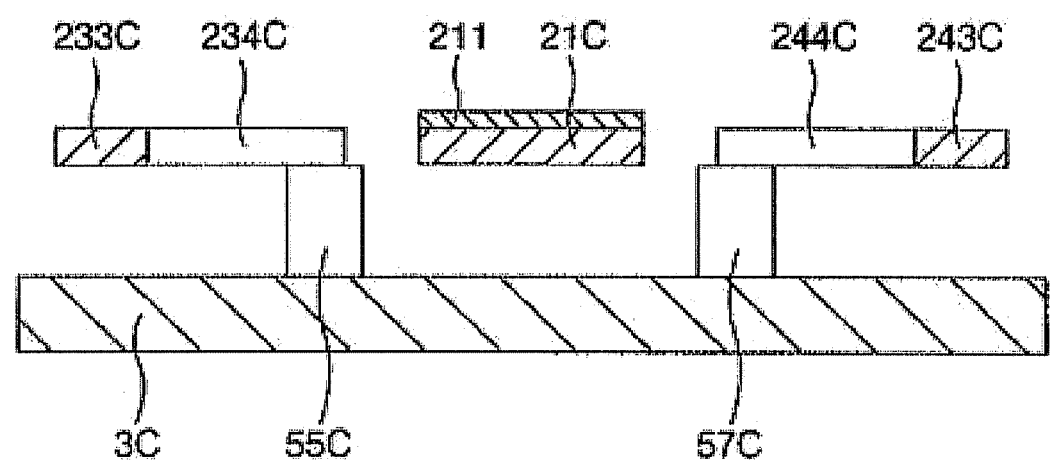
FIG. 11 is a sectional view taken along a line D-D in FIG. 10.

FIG. 10 is a top view illustrating the actuator of the fourth embodiment. FIG. 11 is a sectional view taken along the line D-D in FIG. 10.

The following description of an actuator 1C of the fourth embodiment focuses primarily on differences from the actuator 1B of the third embodiment, and similar points will be omitted.

The actuator 1C of the fourth embodiment is nearly the same as the actuator 1B of the third embodiment except for the structure of a base 2C, the shape of the support substrate 3, and arrangements of the piezoelectric elements 55C to 58C. The same numeral is given to the same structure of the third embodiment.

The base 2C includes a movable plate 21C, a linking portion 23C linking the movable plate 21C and each of the piezoelectric elements 55C and 56C, and a linking portion 24C linking the movable plate 21C and each of the piezoelectric elements 57C and 58C.

The linking portion 23C includes a driving member 233C disposed apart from the movable plate 21C, an axial member 231C linking the driving member 233C and the movable plate 21C, an elastic member 234C linking the driving member 233C and the piezoelectric element 55C and an elastic member 235C linking the driving member 233C and the piezoelectric element 56C.

Likewise, the linking portion 24C includes a driving member 243C disposed apart from the movable plate 21C, an axial member 241C linking the driving member 243C and the movable plate 21C, an elastic member 244C linking the driving member 243C and the piezoelectric element 57C and an elastic member 245C linking the driving member 243C and the piezoelectric element 58C.

The support substrate 3C has a plate shape. On the upper surface, each of the piezoelectric elements 55C to 58C is bonded.

The piezoelectric element 55C is disposed so that one end thereof is on the upper surface of the support substrate 3C while the other end thereof is on and faces an end, opposite to the driving member 233C in the longitudinal direction of the elastic member 234C, of the elastic member 234C, as shown in FIG. 11. The piezoelectric element 55C is elongated and contracted in the thickness direction of the movable plate 21C. The piezoelectric element 55C is bonded to the support substrate 3C with the one end surface (a lower end surface) in the elongation-contraction direction, and also bonded to an end, opposite to the driving member 233C in the longitudinal direction of the elastic member 234C, of the elastic member 234C with the other end surface (an upper end surface). That is, the piezoelectric element 55C is provided so as to link the elastic member 234C and the support substrate 3C in the elongation-contraction direction.

The piezoelectric elements 56C to 58C are disposed on the upper surface of the support substrate 3C in the same manner of the piezoelectric element 55C. That is, the piezoelectric element 56C is provided so as to link the elastic member 235C and the support substrate 3C in its elongation-contraction direction, the piezoelectric element 57C is provided so as to link the elastic member 244C and the support substrate 3C in its elongation-contraction direction, and the piezoelectric element 58C is provided so as to link the elastic member 245C and the support substrate 3C in its elongation-contraction direction.

Each of the piezoelectric elements 55C to 58C is elongated and contracted by an energization, thereby rotating the movable plate 21C. Voltage is applied to the piezoelectric elements 55C to 58C to rotate the movable plate 21C in the same manner of the third embodiment. Thus, the explanation is omitted.

As described above, it can be said that the piezoelectric elements 55C to 58C serve as a driving source and a supporter to support the base 2C. Since the piezoelectric elements 55C to 58C serve as the supporter to support the base 2C, the actuator 1C can be miniaturized.

The actuator 1C of the fourth embodiment may be provided with a frame formed so as to surround the circumference of the base 2C.

The fourth embodiment can also achieve the same effects of the first embodiment.

Fifth Embodiment

Next, an actuator according to a fifth embodiment of the invention will be described.

Figure 12:
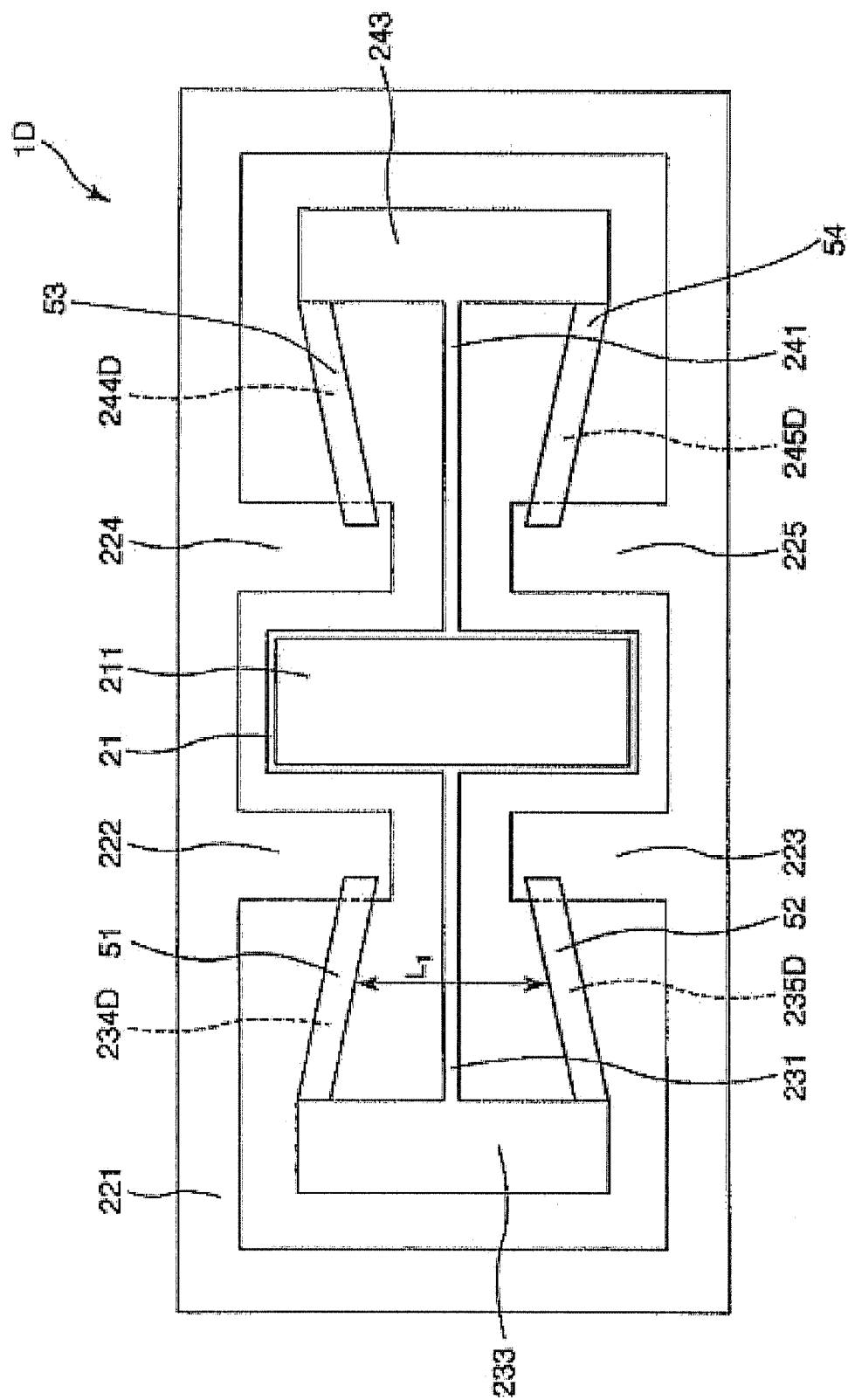
FIG. 12 is a top view illustrating an actuator of a fifth embodiment of the invention.

FIG. 12 is a top view illustrating the actuator of the fifth embodiment.

The following description of an actuator 1D of the fifth embodiment focuses primarily on differences from the actuator 1 of the first embodiment, and similar points will be omitted.

The actuator 1D of the fifth embodiment is nearly the same as the actuator 1 of the first embodiment except for the arrangements of the elastic members 234D, 235D, 244D, and 245D. The same numeral is given to the same structure of the first embodiment.

Since a pair of the elastic members 234D and 235D, and a pair of elastic members 244D and 245D are symmetrically disposed relative to the movable plate 21 in the plan view of the movable plate 21, only the pair of the elastic members 234D and 235D will be representatively described. The description of the pair of elastic members 244D and 245D is omitted.

The pair of elastic members 234D and 235D is disposed so that a separation distance $L_1$ gradually increases from a side adjacent to the movable plate 21 to a side adjacent to the driving member 233. As a result, the length of each of the elastic members 234D and 235D in the longitudinal direction can be set longer than that set in a case where the pair of elastic members 234D and 235D extends in a direction in parallel with the rotation center axis X (i.e. the first embodiment). Consequently, the driving member 233 can provide a larger swing angle (rotation angle) while the actuator 1 is miniaturized.

In addition, the response of the driving member 233 can be improved since the pair of elastic members 234D and 235D can be connected to an end portion, located far from the rotation center axis X, of the driving member 233 in the plan view of the movable plate 21.

The fifth embodiment can also achieve the same effects of the first embodiment.

Sixth Embodiment

Next, an actuator according to a sixth embodiment of the invention will be described.

Figure 13:
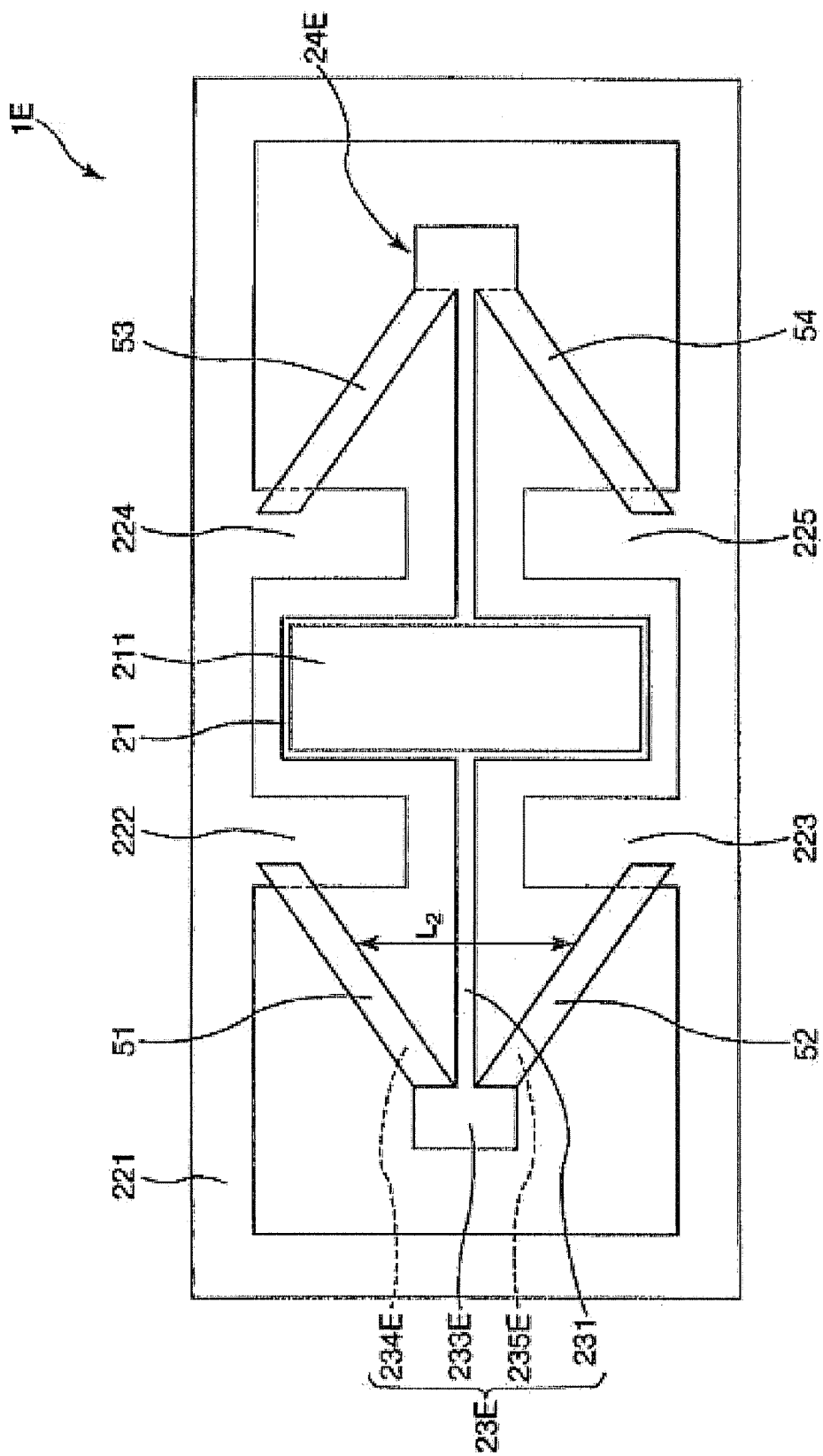
FIG. 13 is a top view illustrating an actuator of a sixth embodiment of the invention.

FIG. 13 is a top view illustrating the actuator of the sixth embodiment.

The following description of an actuator 1E of the sixth embodiment focuses primarily on differences from the actuator 1 of the first embodiment, and similar points will be omitted.

The actuator 1E of the sixth embodiment is nearly the same as the actuator 1 of the first embodiment except for the structures of the linking portions 23E and 24E. The same numeral is given to the same structure of the first embodiment.

Since the linking portions 23E and 24E have the same structure, the linking portion 23E will be representatively described. The description of the linking portion 24E is omitted.

The linking portion 23E includes a driving member 233E disposed apart from the movable plate 21, the axial member 231 linking the driving member 233E and the movable plate 21, and a pair of elastic members 234E and 235E linking the driving member 233E and the supporter 22.

The pair of elastic members 234E and 235E is disposed so that a separation distance $L_2$ gradually decreases from a side adjacent to the movable plate 21 to a side adjacent to the driving member 233. As a result, the length of each of the elastic members 234E and 235E in the longitudinal direction can be set longer than that set in a case where the pair of elastic members 234E and 235E extends in a direction in parallel with the rotation center axis X (i.e. the first embodiment), for example. That is, the elastic members 234E and 235E can provide a larger bending deformation amount. Consequently, the driving member 233E can provide a larger swing angle (rotation angle) while the actuator 1 is miniaturized.

In addition, the separation distance between the border portion of the driving member 233E and the elastic member 234E, and the border portion of the driving member 233E and the elastic member 235E can be set smaller than that of the actuator 1 of the first embodiment. As a result, the driving member 233E can provide a larger rotation angle, thereby increasing the rotation angle of the movable plate 21.

The sixth embodiment can also demonstrate the same effects of the first embodiment.

Seventh Embodiment

Next, an actuator according to a seventh embodiment of the invention will be described.

Figure 14:
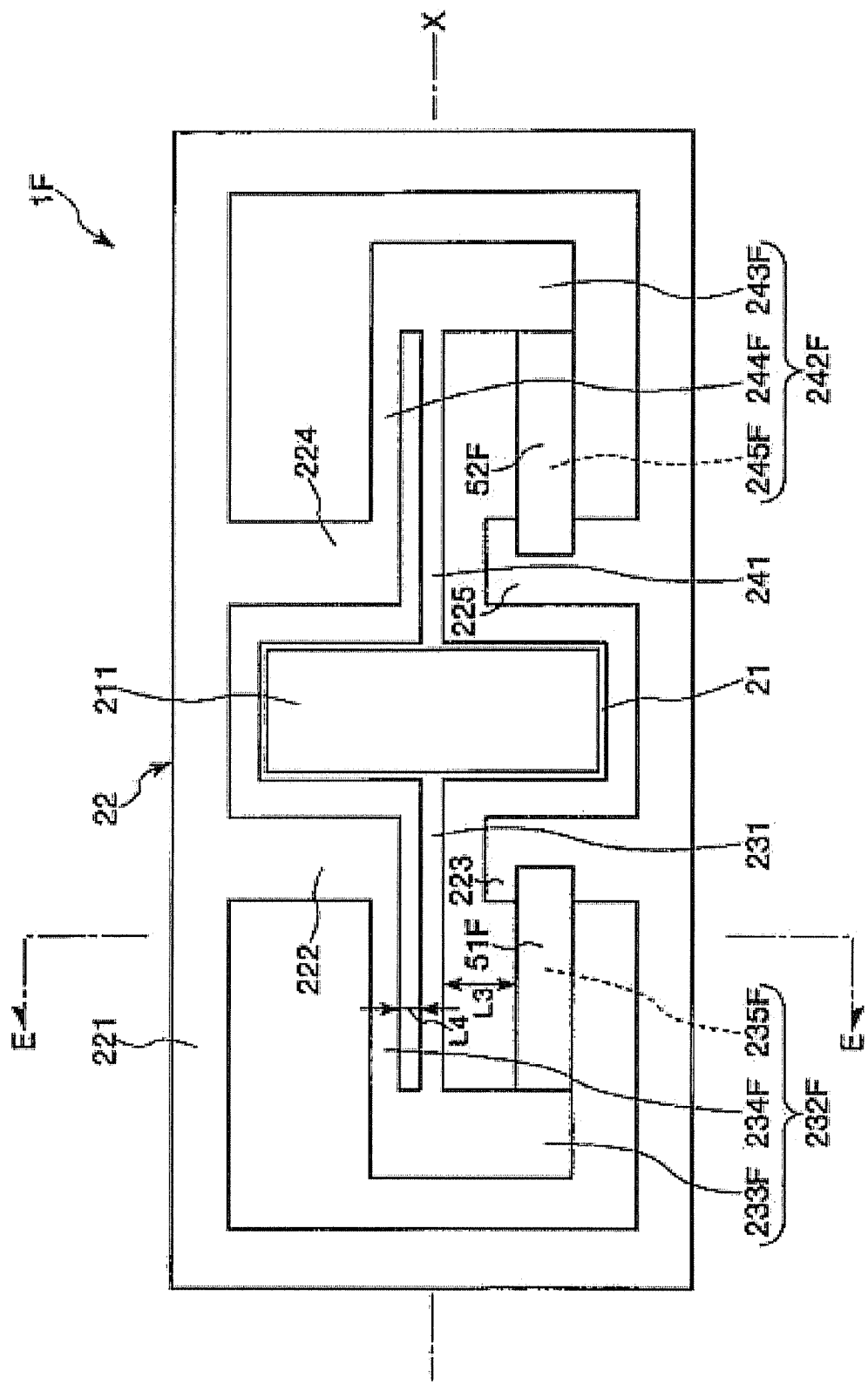
FIG. 14 is a top view illustrating an actuator of a seventh embodiment of the invention.
Figure 15A:
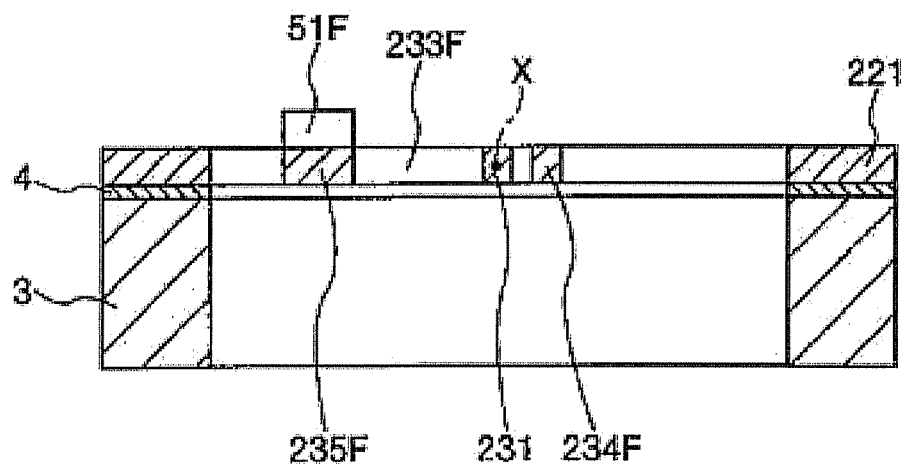
FIGS. 15A and 15B are sectional views taken along a line E-E of FIG. 14.
Figure 15B:
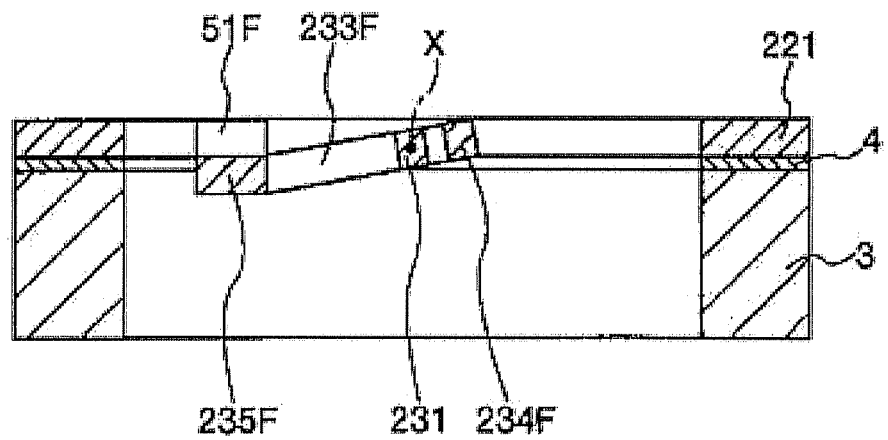

FIG. 14 is a top view illustrating the actuator of the seventh embodiment. FIG. 15 is a sectional view taken along the line E-E in FIG. 14. In the following description, for expository convenience, the top side in FIGS. 14, 15A and 15B is described as "up," while the bottom side is described as "down or low."

The following description of an actuator 1F of the seventh embodiment focuses primarily on differences from the actuator 1 of the first embodiment, and similar points will be omitted.

The actuator 1F of the seventh embodiment is nearly the same as the actuator 1 of the first embodiment except for the structures of the returned portions 232F and 242F. The same numeral is given to the same structure of the first embodiment.

The returned portions 232F and 242F are symmetrically disposed relative to the movable plate 21 as shown in FIG. 14.

The returned portion 232F includes a driving member 233F connected to the left end of the axial member 231, a first elastic member 235F linking the driving member 233F and the protrusion 223, and a second elastic member 234F linking the driving member 233F and the protrusion 222.

Likewise, the returned portion 232F includes a driving member 243F connected to the right end of the axial member 231, a first elastic member 245F linking the driving member 243F and the protrusion 225, and a second elastic member 244F linking the driving member 243F and the protrusion 224.

The actuator 1F includes a pair of piezoelectric elements 51F and 52F. The piezoelectric element 51F is bonded to the first elastic member 235F while the piezoelectric element 52F is bonded to the first elastic member 245F.

In the actuator 1F, the piezoelectric elements 51F and 52F are driven to bend the first elastic members 235f and 245F, respectively. Each deformation twists the respective second elastic members 234F and 244F to rotate the driving members 233F and 234F, respectively. The rotations of the driving members 233F and 243F give a distortional moment to the respective axial members 231 and 241.

Each of the driving members 233F and 243F has an elongated shape extending in a direction in parallel with the plate surface of the movable plate 21 and perpendicular to the rotation center axis X. The driving member 233F is connected to the axial member 231 at a position thereof located upper side from the center in its longitudinal direction while the driving member 243F is connected to the axial member 241 at a position thereof located upper side from the center in its longitudinal direction.

Each of the first elastic members 235F and 245F is designed to mainly provide a bending deformation, and has an elongated shape extending in a direction nearly in parallel with the rotation center axis X. The first elastic members 235F and 245F are disposed at the lower side relative to the rotation center axis X in FIG. 14.

The first elastic member 235F is capable of being elastically deformed. The right end is fixed to the protrusion 223 while the left end is linked to the lower end portion of the driving member 233F. Likewise, the first elastic member 245F is capable of being elastically deformed. The left end is fixed to the protrusion 225 while the right end is linked to the lower end portion of the driving member 243F.

On the other hand, each of the second elastic members 234F and 244F is designed to mainly provide a twisted deformation, and has an elongated shape extending in a direction nearly in parallel with the rotation center axis X. The width of the second elastic member 234F is smaller than that of the first elastic member 235F while the width of the second elastic member 244F is smaller than that of the first elastic member 245F so that each of the second elastic members 234F and 244F is easily twisted.

The second elastic members 234F and 244F are disposed at the upper side relative to the rotation center axis X in FIG. 14. In addition, the second elastic members 234F and 244F are disposed in the vicinity of the rotation center axis X.

The second elastic member 234F is capable of being elastically deformed. The right end is fixed to the protrusion 222 while the left end is linked to the upper end portion of the driving member 233F. Likewise, the second elastic member 244F is capable of being elastically deformed. The left end is fixed to the protrusion 224 while the right end is linked to the upper end portion of the driving member 243F.

The first elastic member 235F and the second elastic member 234F are disposed at a side adjacent to the movable plate 21 relative to the driving member 233F (i.e. inwardly from the driving member 233F) while the first elastic member 245F and the second elastic member 244F are disposed at a side adjacent to the movable plate 21 relative to the driving member 243F (i.e. inwardly from the driving member 243F).

In the returned portion 232F, the separation distance of the first elastic member 235F and the axial member 231 (L3 in FIG. 14) is larger than the separation distance of the second elastic member 234F and the axial member 231 (L4 in FIG. 14).

Likewise, in the returned portion 242F, the separation distance of the first elastic member 245F and the axial member 241 is larger than the separation distance of the second elastic member 244F and the axial member 241.

The piezoelectric element 51F is bonded on the first elastic member 235F, and is elongated and contracted in its longitudinal direction. On the other hand, the piezoelectric element 52F is bonded on the first elastic member 245F, and is elongated and contracted in its longitudinal direction. As can be seen from the above arrangement, the piezoelectric elements 51F and 52F are eccentrically located at one side of the rotation center axis X (the lower side in FIG. 14).

Since the piezoelectric elements 51F and 52F have the same structure of the piezoelectric element 52 described in the first embodiment, the description on them is omitted.

The actuator 1F structured as described above is driven by the following manner as an example. Since the actuator 1F has a symmetric structure relative to the movable plate 21, the left portion of the actuator 1F (i.e., the returned portion 232F) will be representatively described below.

A periodically changing voltage is applied to the piezoelectric element 51F to operate the actuator 1F. The voltage may be alternating current or intermittent direct current, for example.

Since the piezoelectric elements 51F and 52F are eccentrically located at one side of the rotation center axis X as described above, voltage is applied to each of the piezoelectric elements 51F and 52F so that the pair of piezoelectric elements 51F and 52F is elongated and contracted with the same timing. As a result, driving circuits and power supply sources (not shown) to drive the piezoelectric elements 51F and 52F can be simply structured.

In addition, voltage applied to each of the piezoelectric elements 51F and 52F preferably periodically changes with a frequency equal to the resonance frequency of a twist vibrator composed of the movable plate 21 and the pair of axial members 231 and 241. The voltage allows the movable plate 21 to provide a large rotation angle while the deformation amounts of the first elastic members 235F and 245F, the second elastic members 234F and 244F, the driving members 233F and 243F, and the piezoelectric elements 51F and 52F are suppressed. That is, the movable plate 21 can provide a larger rotation angle with a low power drive.

With such voltage applied, the piezoelectric element 51F is elongated and contracted in its longitudinal direction (the longitudinal direction of the first elastic member 235F). That is, the piezoelectric elements 51F alternately repeats the elongation state and the contraction state with the voltage frequency.

More specifically, the piezoelectric element 51F is in the contraction state as shown in FIG. 15A when no voltage is applied. In the state, the first elastic member 235F is not bent (not bent downwardly), and the second elastic member 234F is not also twisted. In contrast, the piezoelectric element 51F is in the elongation state as shown in FIG. 15B when voltage is applied. In the state, the first elastic member 235F is bent downwardly. The deformation of the first elastic member 235F induces the displacement of the left end portion of the driving member 233F in FIGS. 15A and 15B. In this case, the position of the right end portion of the driving member 233F is mostly unchanged since the right end portion of the driving member 233F is supported by the second elastic member 234F. As a result, the driving member 233F is tilted (displaced) as shown in FIG. 15B. When no voltage is applied to the piezoelectric element 51F in the duration in which the piezoelectric element 51F alternately repeats the elongation state and the contraction state with a predetermined period, the second elastic member 234F is twisted in the direction opposite to that shown in FIG. 15B by an reactive force of the second elastic member 234F twisted and the first elastic member 235F bent, and the first elastic member 235F is bent upwardly.

The posture change of the driving member 233F induces the posture tilt of the axial member 231 in its traverse plane. As a result, distortional torque is given to the axial member 231.

With the distortional torque, the axial member 231 is twisted to rotate the movable plate 21 about the rotation center axis X.

The actuator 1F can reduce the number of parts used other than the same effects of the actuator 1 of the first embodiment since single piezoelectric element gives distortional torque to each of the axial members 231 and 241 to rotate the movable plate 21 with suppressing the shift of the rotation center axis X.

Particularly, the shift of the rotation center axis X of the movable plate 21 can be prevented even when a driving force is applied to only one side of each of the driving members 233F and 243F relative to the rotation center axis X (the lower side of FIG. 14) since the rotation center axis X is positioned in the vicinity of each of the second elastic members 234F and 244F that are twisted. Since the necessary number of piezoelectric elements to rotate the movable plate 21 (in the embodiment, two pieces: the piezoelectric elements 51F and 52F) is small, the actuator 1F can be provided at low costs. Because of the small number of piezoelectric elements, it becomes simple to smoothly rotate the movable plate 21 with a little influence of a fixing position shift or dimension error of each piezoelectric element.

In addition, the rotation center axis X of the movable plate 21 can also be prevented from being shifted from the following point of view. Each of the second elastic members 234F and 244F is twisted (mainly distortional deformation) and each of the first elastic members 235F and 245F is bent (mainly bending deformation) when each of the driving members 233F and 243F rotates.

Further, the rotation center axis X of the movable plate 21 can also be prevented from being shifted with the pair of axial members 231 and 241 having a simplified shape since each of the second elastic members 234F and 244F is disposed in the vicinity of the rotation center axis X.

The embodiments of the actuator have been described above. The actuator can be used for MEMS applied sensors such as acceleration sensors and angular velocity sensors, and optical devices such as optical scanners, optical switches, and optical attenuators.

An optical scanner of the invention has a similar structure of the actuator. Since embodiments of the optical scanner are similar to the embodiments described above, detailed descriptions are omitted. The optical scanner can be preferably applied to image forming devices such as projectors, laser printers, displays for imaging, barcode readers, and confocal scanning microscopes. As a result, image forming devices having superior imaging characteristics can be provided.

Figure 16:
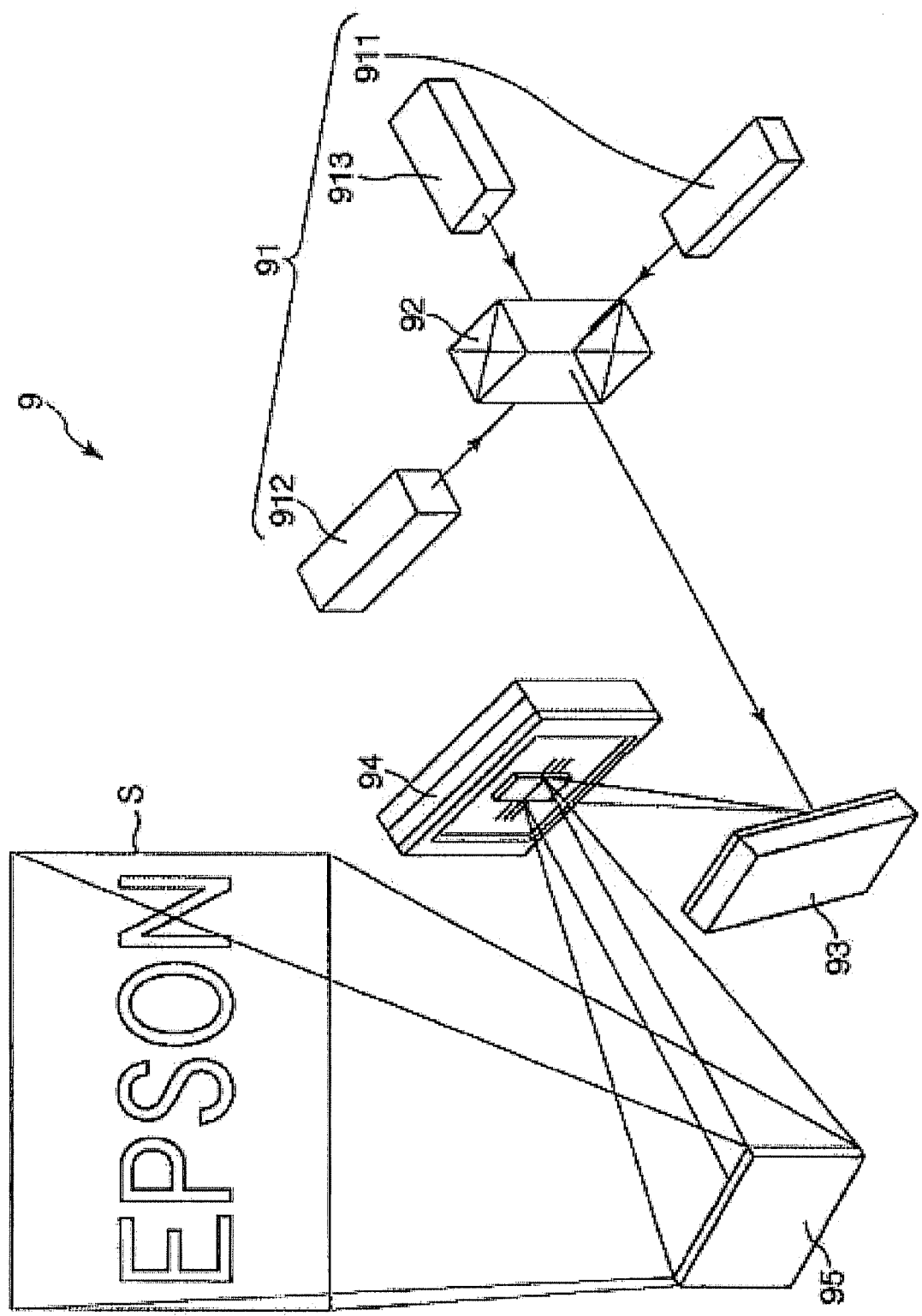
FIG. 16 is a schematic view illustrating an image forming device using an optical scanner of the invention.

A projector 9 shown in FIG. 16 will be specifically described. For expository convenience, the longitudinal direction of a screen S is denoted as a "horizontal direction" and a direction perpendicular to the longitudinal direction is denoted as a "vertical direction".

The projector 9 includes a light source device 91 emitting light such as a laser beam, a cross dichroic prism 92, a pair of optical scanners 93 and 94 of the invention (e.g. optical scanner having a similar structure of the actuator 1), and a fixed mirror 95.

The light source device 91 is provided with a red light source device 911 emitting a red light component, a blue light source device 912 emitting a blue light component, and a green light source device 913 emitting a green light component.

The cross dichoric prism 92, which is composed of four right angle prisms bonded together, combines a light component emitted from each of the red light source device 911, the blue light source device 912, and the green light source device 913.

In the projector 9, a light component emitted from each of the red light source device 911, the blue light source device 912, and the green light source device 913 based on image information from a host computer (not shown) is combined by the cross dichonic prism 92. The combined light is scanned by the optical scanners 93 and 94 and then reflected by the fixed mirror 95 to form a color image on the screen S.

The optical scan by the optical scanners 93 and 94 is specifically described.

The light combined by the cross dichonic prism 92 is scanned in the horizontal direction by the optical scanner 93 (main scan). Then, the horizontally scanned light is scanned in the vertical direction by the optical scanner 94 (sub scan). As a result, a two-dimensional color image can be formed on the screen S. The optical scanners 93 and 94 can provide extremely superior imaging characteristics.

The structure of the projector 9 is not limited to one described above as long as it is structured to scan light by an optical scanner to form an image to an object. For example, the fixed mirror 95 may be omitted.

While the actuator, the optical scanner, and the image forming device of the invention are described based on the illustrated embodiments thus far, but the invention is not limited to those embodiments. For example, the actuator, the optical scanner, and the image forming device of the invention may include any substitute that has the same function as its original structure and may include any additional structure.

While the actuator has a nearly symmetric structure relative to the movable plate 21 in the embodiments described above, it may have an asymmetric structure.

In addition, while the returned portion includes the driving member and a pair of elastic members in the embodiments described above, the structure is not limited to this as long as it can tolerate the elongation of the axial member due to thermal expansion and reduce its displacement in the thickness direction of the movable plate. For example, the returned portion may include the pair of the elastic members without employing the driving member. In this case, each elastic member links the ends portion of the axial member and the supporter. Further, it is not necessary that the elastic member be provided in a pair. Single elastic member may be provided. More than two elastic members may be provided.

What is claimed is:

1. An actuator, comprising:
a movable plate;
a supporter to support the movable plate;
a pair of linking portions to link the movable plate and the supporter so as to allow the movable plate to rotate relative to the supporter; and
a piezoelectric element to rotate the movable plate,
wherein the piezoelectric element elongated and contracted by an energization twists the pair of linking portions to rotate the movable plate;
each of the pair of the linking portions includes:
an axial member extending from the movable plate,
a driving member connected to the axial member, and
a pair of elastic members capable of being elastically deformed connected to opposing ends of the driving member, each elastic member having a first end connected to the driving member and a second end that is closer to the movable plate than the first end, each elastic member extending from the first end axially back toward the movable plate to the second end,
wherein each of the pair of elastic members faces each other across a rotation center axis of the movable plate.

2. The actuator according to claim 1, wherein each of the pair of elastic members has an elongation shape and a longitudinal direction of each of the elastic members is in parallel with the rotation center axis of the movable plate.

3. The actuator according to claim 1, wherein each of the pair of elastic members includes a first elastic member and a second elastic member having a separation distance smaller than a separation distance of the first elastic element relative to the axial member, and the piezoelectric element is bonded to the first elastic member, and an elongation-contraction of the piezoelectric element in a longitudinal direction of the first elastic member bends the first elastic member to twist the second elastic member to displace the driving member.

4. The actuator according to claim 3, wherein the second elastic member is provided in a vicinity of the rotation center axis.

5. The actuator according to claim 1, wherein each of the pair of elastic members has an elongation shape and a separation distance between the pair of elastic members gradually decreases from a side adjacent to the movable plate to a side adjacent to the driving member.

6. The actuator according to claim 1, wherein each of the pair of elastic members has an elongation shape and a separation distance between the pair of elastic members gradually increases from a side adjacent to the movable plate to a side adjacent to the driving member.

7. The actuator according to claim 1, wherein each of the pair of elastic members has an elongation shape and the piezoelectric element is bonded to each of the elastic members in a longitudinal direction of each of the elastic members and is elongated and contracted in the longitudinal direction to bend each of the elastic members.

8. The actuator according to claim 7, wherein each piezoelectric element has a width larger than a width of each of the elastic members and is bonded so as to entirely cover each of the elastic members in a width direction of each of the elastic members.

9. The actuator according to claim 1, wherein the piezoelectric element is provided to correspond to each of the elastic members, and an end in an elongation-contraction direction of each piezoelectric element touches each of corresponding elastic members, and an elongation-contraction of each piezoelectric element bends each of the elastic members.

10. The actuator according to claim 9, wherein each of the pair of elastic members has an elongation shape and each piezoelectric element is bonded to an end in an elongation direction of each of the corresponding elastic members and serves as the supporter, and the end is located at a side opposite to the driving member.

11. The actuator according to claim 1, wherein the movable plate has a light reflector having light reflection property on a plate surface thereof.

12. An optical scanner, comprising:
a movable plate provided with a light reflector having light reflection property;
a supporter to support the movable plate;
a pair of linking portions to link the movable plate and the supporter so as to allow the movable plate to rotate relative to the supporter; and
a piezoelectric element to rotate the movable plate,
wherein the piezoelectric element elongated and contracted by an energization twists the pair of linking portions to rotate the movable plate to scan light reflected by the light reflector;
each of the linking portions includes:
an axial member extending from the movable plate,
a driving member connected to the axial member, and
a pair of elastic members capable of being elastically deformed connected to opposing ends of the driving member, each elastic member having a first end connected to the driving member and a second end that is closer to the movable plate than the first end, each elastic member extending from the first end axially back toward the movable plate to the second end,
wherein each of the pair of elastic members faces each other across a rotation center axis of the movable plate.

13. An image forming device, comprising:
an optical scanner including:
a movable plate provided with a light reflector having light reflection property;
a supporter to support the movable plate;
a pair of linking portions to link the movable plate and the supporter so as to allow the movable plate to rotate relative to the supporter; and
a piezoelectric element to rotate the movable plate,
wherein the piezoelectric element elongated and contracted by an energization twists the pair of linking portions to rotate the movable plate to scan light reflected by the light reflector;
each of the linking portions includes:
an axial member extending from the movable plate,
a driving member connected to the axial member, and
a pair of elastic members capable of being elastically deformed connected to opposing ends of the driving member, each elastic member having a first end connected to the driving member and a second end that is closer to the movable plate than the first end, each elastic member extending from the first end axially back toward the movable plate to the second end,
wherein each of the pair of elastic members faces each other across a rotation center axis of the movable plate.

14. An actuator, comprising:
a movable plate;
a supporter to support the movable plate;
a pair of linking portions to link the movable plate and the supporter so as to allow the movable plate to rotate relative to the supporter; and
a piezoelectric element to rotate the movable plate,
wherein the piezoelectric element elongated and contracted by an energization twists the pair of linking portions to rotate the movable plate;
each of the pair of the linking portions includes:
an axial member extending from the movable plate,
a driving member connected to the axial member, and
a pair of elastic members capable of being elastically deformed connected to opposing ends of the driving member and extending between the movable plate and the driving member,
wherein each of the pair of elastic members faces each other across a rotation center axis of the movable plate.

* * * * *